(12) United States Patent
Itkin

(10) Patent No.: US 11,251,785 B1
(45) Date of Patent: Feb. 15, 2022

(54) SPURIOUS COMPONENTS REDUCTION

(71) Applicant: Infineon Technologies AG, Neubiberg (DE)

(72) Inventor: Grigory Itkin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/215,880

(22) Filed: Mar. 29, 2021

(51) Int. Cl.
| G05F 1/10 | (2006.01) |
| G05F 3/02 | (2006.01) |
| H03K 5/1252 | (2006.01) |
| H02M 3/155 | (2006.01) |
| H03K 5/00 | (2006.01) |

(52) U.S. Cl.
CPC .......... *H03K 5/1252* (2013.01); *H02M 3/155* (2013.01); *H03K 2005/00286* (2013.01)

(58) Field of Classification Search
CPC . G05F 3/262; G05F 3/265; G05F 3/30; G05F 3/205; G11C 5/147
USPC .......................................................... 327/538
See application file for complete search history.

(56) References Cited

U.S. PATENT DOCUMENTS

| 2006/0280314 A1* | 12/2006 | Okada | H03F 3/217 |
| | | | 381/71.1 |
| 2009/0161793 A1* | 6/2009 | Nentwig | H03F 1/0227 |
| | | | 375/297 |
| 2011/0285370 A1* | 11/2011 | Gritti | H02M 3/1588 |
| | | | 323/282 |
| 2016/0327970 A1* | 11/2016 | Belet | G06F 1/26 |

* cited by examiner

*Primary Examiner* — Quan Tra
*Assistant Examiner* — Anh-Quan Tra
(74) *Attorney, Agent, or Firm* — Slater Matsil, LLP

(57) ABSTRACT

An integrated circuit includes a first input port configured to receive a supply voltage from a switched-mode power supply (SMPS), where frequency components of the supply voltage include harmonics of a reference frequency, where the reference frequency is equal to a first frequency divided by a factor; and a spurious components cancellation circuit coupled to the first input port, where the spurious components cancellation circuit is configured to: generate a first clock signal having the reference frequency; adjust an amplitude and a phase of the first clock signal to form a compensation signal; and add the compensation signal to the supply voltage to produce a modified supply voltage with reduced frequency components at one or more harmonic frequencies of the reference frequency.

21 Claims, 18 Drawing Sheets

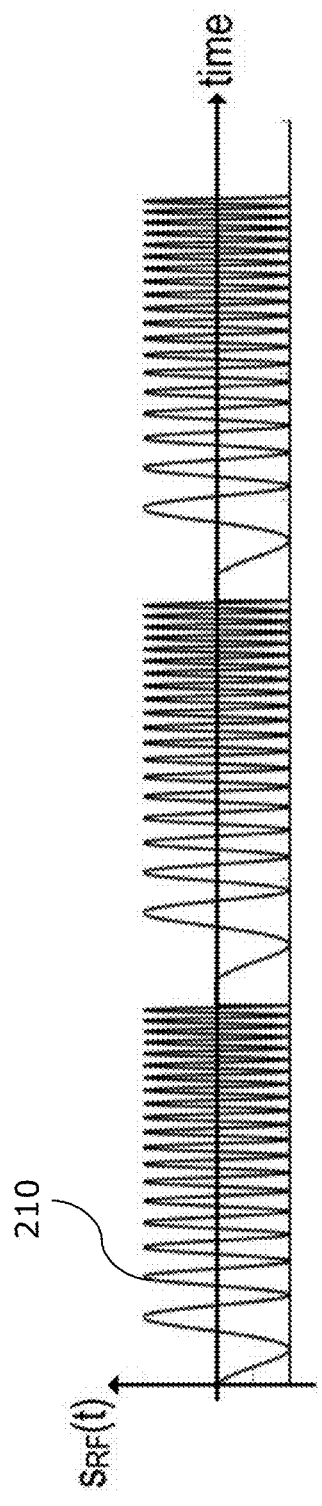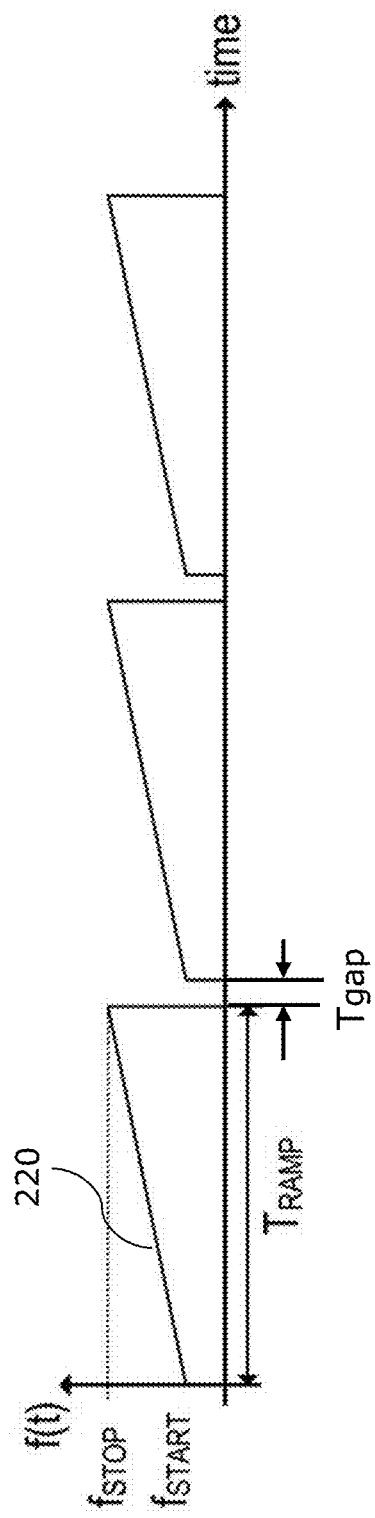

SPURIOUS COMPONENTS REDUCTION

TECHNICAL FIELD

The present invention relates generally to systems and methods for spurious components reduction.

BACKGROUND

Power supply systems are pervasive in many electronic applications from computers to automobiles. Generally, voltages within a power supply system are generated by performing a DC-DC, DC-AC, and/or AC-DC conversion from one power domain to another power domain. One class of such systems includes switched mode power supplies (SMPS). An SMPS is usually more efficient than other types of power conversion systems because power conversion is performed by controlled charging and discharging of the inductor or transformer and reduces energy lost due to power dissipation across resistive voltage drops.

A switched mode power supply (SMPS) usually includes at least one switch and an inductor or transformer. Some specific topologies include buck converters, boost converters, and flyback converters, among others. A clock signal having a clock frequency is supplied to the SMPS, and a control circuit is commonly used to open and close the switch at the clock frequency to charge and discharge the inductor.

Due to, e.g., fast edge transitions during switching, the output of the SMPS may include spurious components (e.g., harmonic frequency components of the clock frequency). For example, a supply voltage generated at the output of the SMPS may include a DC component (e.g., a +5V voltage signal) and harmonic frequency components of the clock frequency. When the output of the SMPS is used to power other circuits, the harmonic frequency components of the clock frequency may be coupled to the signals of the other circuits, and may degrade the performance of the other circuits. There is a need in the art for systems and methods for reducing the spurious components caused by the SMPS.

SUMMARY

In accordance with an example of the present invention, an integrated circuit includes a first input port configured to receive a supply voltage from a switched-mode power supply (SMPS), where frequency components of the supply voltage include harmonics of a reference frequency, where the reference frequency is equal to a first frequency divided by a factor; and a spurious components cancellation circuit coupled to the first input port, where the spurious components cancellation circuit is configured to: generate a first clock signal having the reference frequency; adjust an amplitude and a phase of the first clock signal to form a compensation signal; and add the compensation signal to the supply voltage to produce a modified supply voltage with reduced frequency components at one or more harmonic frequencies of the reference frequency.

In accordance with an example of the present invention, a system includes a controller and a power management integrated circuit (PMIC) coupled to the controller, wherein the PMIC comprises: a first frequency divider, wherein the first frequency divider is configured to generate a reference clock signal by dividing a first clock signal by a programmable factor, wherein the programmable factor is sent from the controller, wherein the reference clock signal has a reference frequency; and a switched-mode power supply (SMPS) driven by the reference clock signal, wherein the SMPS is configured to generate, at an output of the SMPS, a supply voltage, wherein the supply voltage comprises a DC component and harmonic frequency components of the reference frequency. The system further includes an integrated circuit (IC) coupled to the PMIC and the controller, wherein the IC comprises: a first input port coupled to the output of the SMPS; and a harmonics reduction circuit coupled to the first input port, wherein the harmonics reduction circuit is configured to receive the programmable factor from the controller, and is configured to attenuate the harmonic frequency components of the reference frequency.

In accordance with an example of the present invention, a method of operating a system comprising a controller, a power supply circuit, and a signal processing circuit includes: sending a value from the controller to the power supply circuit, wherein the power supply circuit includes a first frequency divider and a switched-mode power supply (SMPS); dividing, by the first frequency divider, a first clock signal by the value to generate a reference clock signal having a reference frequency; generating, by the SMPS, a supply voltage, wherein the SMPS is driven by the reference clock signal, wherein the supply voltage comprises harmonic frequencies of the reference frequency; sending the supply voltage to an input port of the signal processing circuit; removing, by a harmonics reduction circuit of the signal processing circuit, signal components at the harmonic frequencies of the reference frequency from the supply voltage to generate a modified supply voltage; and powering internal circuits of the signal processing circuit with the modified supply voltage.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate a transmitted radio frequency (RF) signal of a FMCW radar system in time domain and frequency domain, respectively, in an example;

DETAILED DESCRIPTION OF ILLUSTRATIVE EXAMPLES

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar numerals in different figures refer to the same or similar component.

The present disclosure will be described with respect to examples in a specific context, namely spurious components reduction in a radio frequency (RF) system that uses an SMPS as a power supply. One skilled in the art will readily appreciate that besides RF systems, the principle for spurious components reduction disclosed herein are applicable to other signal processing systems that use an SMPS as a power supply.

Figure 1:
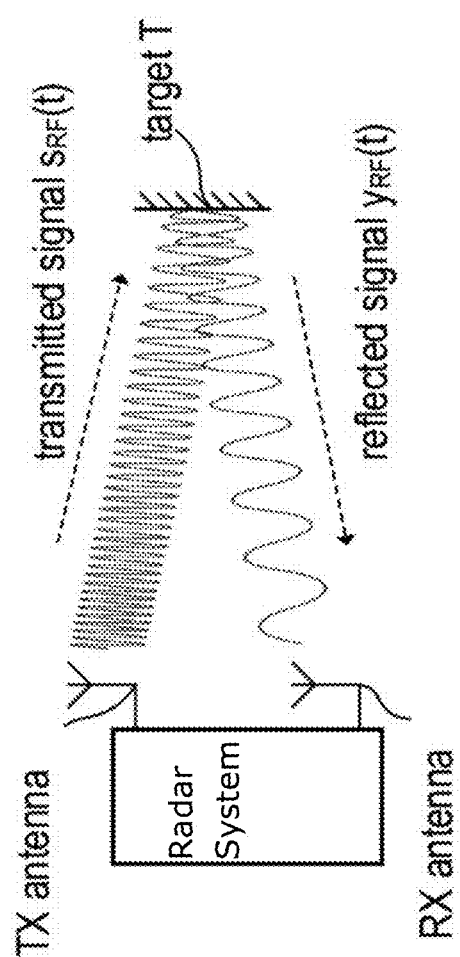
FIG. 1 illustrates the working principle of a frequency-modulated continuous-wave (FMCW) radar system, in an example.

FIG. 1 illustrates the working principle of a frequency-modulated continuous-wave (FMCW) radar system, in an example. In the example of FIG. 1, the FMCW radar system transmits a radio frequency (RF) signal, which is a frequency-modulated continuous wave signal, using a transmit antenna. The transmitted RF signal bounces back from a target, and is received by the FMCW radar system using a receive antenna. In FMCW radar systems, the frequency difference between the received RF signal and the transmitted RF signal increases proportionally with the time delay between the transmitted and received RF signals, the distance between the FMCW radar system and the target can be determined by finding the frequency difference between the transmitted and received RF signals.

FIGS. 2A and 2B illustrate a transmitted RF signal of the FMCW radar system of FIG. 1 in time domain and frequency domain, respectively, in an example. As illustrated in FIGS. 2A and 2B, the transmitted RF signal includes a plurality of frames, where each frame has a duration of $T_{RAMP}$. Each frame of the RF signal is a frequency ramp signal, with the frequency of the RF signal increasing linearly within the frame, as illustrated by curve 220 in FIG. 2B. The corresponding time domain signal is a continuous wave signal with its frequency increasing over time, as illustrated by curve 210 in FIG. 2A. There are gaps $T_{gap}$ between adjacent frames, and no RF signal is transmitted in the gaps between adjacent frames. The RF signal illustrated in FIGS. 2A and 2B is for illustration purpose only and not limiting. Other suitable types of RF signals may also be used for the FMCW radar system.

Figure 3:
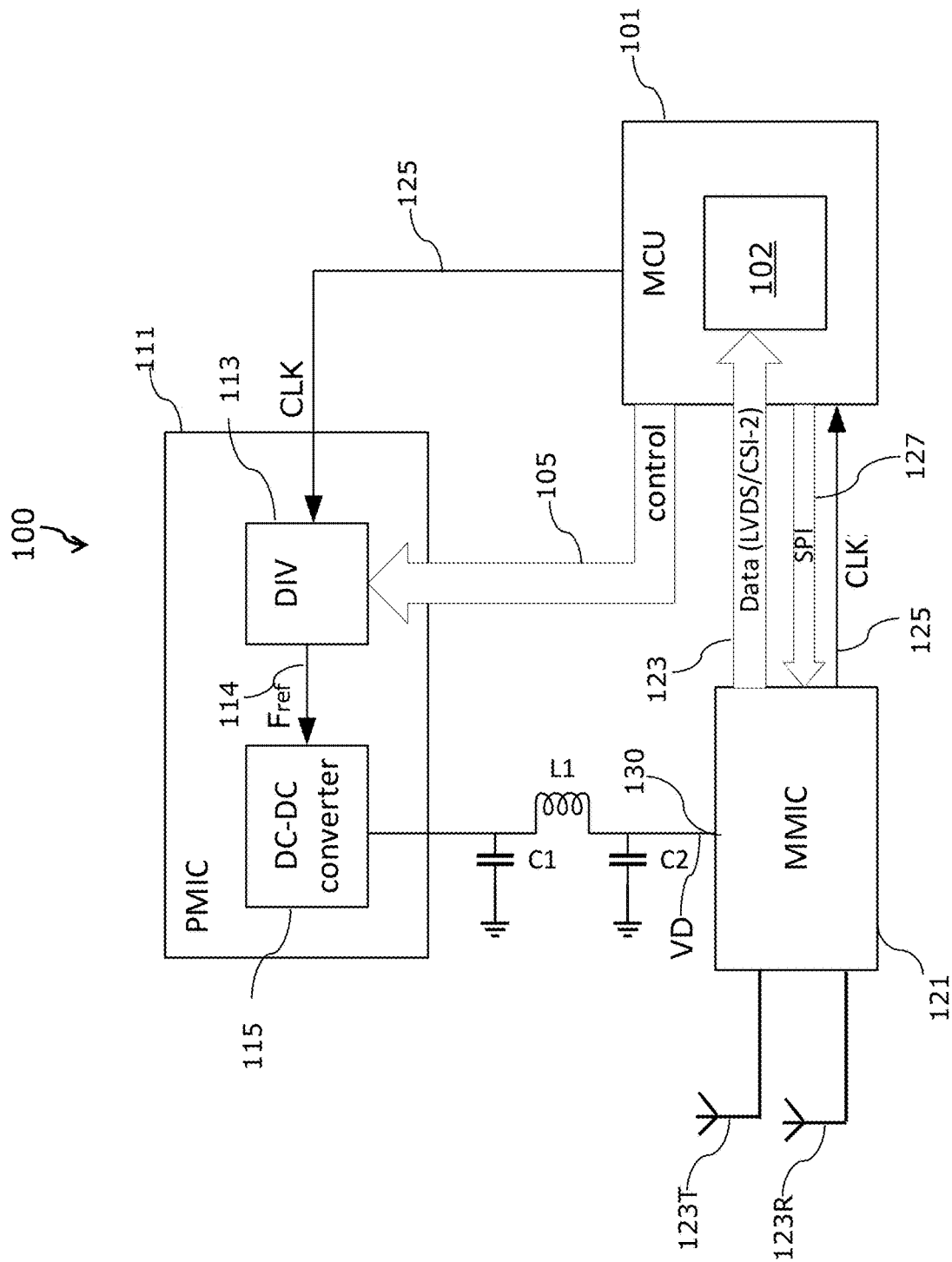
FIG. 3 illustrates a block diagram of a radio frequency (RF) system, in an example.

FIG. 3 illustrates a block diagram of a radio frequency (RF) system 100, in an example. The RF system 100 may be, e.g., the FMCW radar system of FIG. 1. As illustrated in FIG. 3, the RF system 100 includes a controller 101, a power supply circuit 111, and an RF circuit 121. The controller 101 controls the operation of the RF system 100, and may be, e.g., a micro-controller, a digital signal processor (DSP), a central processing unit (CPU), or the like.

The controller 101 communicates with the power supply circuit 111 and the RF circuit 121 through various digital interfaces. The digital interfaces may be any suitable interfaces, such as Serial Peripheral Interface (SPI), Low-Voltage Differential Signaling (LVDS) interface, Camera Serial Interface 2 (CSI-2), or the like. For example, the controller 101 may send control signal to the power supply circuit 111 via a control bus 105, where the control bus 105 is connected between a first digital interface of the controller 101 and a corresponding (e.g., compatible) digital interface of the power supply circuit 111. Similarly, the controller 101 may send control signal to the RF circuit 121 via a control bus 127, and may receive data from the RF circuit 121 through a data bus 123. The control bus 127 is connected between a second digital interface of the controller 101 and a corresponding (e.g., compatible) digital interface (see 143 in FIG. 4A) of the RF circuit 121, and the data bus 123 is connected between a third digital interface of the controller 101 and a corresponding (e.g., compatible) digital interface (see 157 in FIG. 4A) of the RF circuit 121.

As illustrated in FIG. 3, the received data from the RF circuit 121 may be processed by a data processing unit 102 of the controller 101. The data processing unit 102 may include, e.g., a Fast Fourier-Transform (FFT) circuit for performing frequency analysis of the received data. In the example of FIG. 3, a clock signal 125 is generated by the RF circuit 121 and sent to the controller 101, and the controller 101 passes the clock signal 125 to the power supply circuit 111. The clock signal 125 may be generated and/or distributed in other ways. For example, the clock signal 125 may be generated by the RF circuit 121 and sent to the power supply circuit 111 directly. As another example, the clock signal 125 may be generated by a clock generation circuit external to the RF circuit 121 and the power supply circuit 111, and is supplied to the RF circuit 121 and the power supply circuit 111. These and other variations are fully intended to be included within the scope of the present disclosure.

Still referring to FIG. 3, the power supply circuit 111 generates a supply voltage VD for the RF circuit 121. In the example of FIG. 3, the power supply circuit 111 includes a frequency divider 113 and a switched-mode power supply (SMPS) 115. The frequency divider 113 receives a value sent from the controller 101 via the control bus 105, which value indicates a frequency dividing factor. The frequency divider 113 divides the clock signal 125 by the frequency dividing factor to generate a reference clock signal 114 having a reference frequency $F_{ref}$. For example, the clock signal 125 may have a clock frequency of 25 MHz, and the frequency dividing factor may have a programmable value (e.g., an integer programmable value) from, e.g., 10 to 16, which results the reference frequency $F_{ref}$ ranging from, e.g., 2.5 MHz to 1.5625 MHz.

The reference clock signal 114 is sent to the SMPS 115 and is used as a clock signal to drive the SMPS 115. The SMPS 115 may be, e.g., a DC-DC converter. Due to, e.g., fast edge transitions during switching of the SMPS 115, the output of the SMPS 115 not only includes a desired DC component (e.g., a +3V, +5V voltage), but also includes spurious components of the reference clock signal 114, where the spurious components are or include harmonic frequency components of the reference frequency $F_{ref}$ of the reference clock signal 114. In the discussion herein, the harmonic frequency components of the reference frequency $F_{ref}$ refer to frequency components at harmonic frequencies of the reference frequency $F_{ref}$. The harmonic frequencies (also referred to as harmonics) of the reference frequency $F_{ref}$ refer to frequencies at $F_{ref}$, $2\times F_{ref}$, $3\times F_{ref}$, ..., and so on. In other words, the harmonics frequencies of the reference frequency $F_{ref}$ include the reference frequency $F_{ref}$ (also referred to as the fundamental frequency $F_{ref}$) and multiples of the reference frequency $F_{ref}$.

In the illustrated example of FIG. 3, the frequency divider 113 and the SMPS 115 are integrated together in an integrated circuit (IC), such as a power management integrated circuit (PMIC). Therefore, the power supply circuit 111 may also be referred to as a PMIC 111 herein. FIG. 3 further illustrates capacitors C1, C2 and an inductor L1 coupled to the SMPS 115. In some examples, the capacitors C1, C2 and the inductor L1 are needed for the SMPS 115 to function properly, but due to their large capacitance values and inductance value, it may be difficult to integrate the capacitors C1, C2 and the inductor L1 into the PMIC 111. Therefore, the capacitors C1, C2 and the inductor L1 are left as discrete components coupled to the PMIC 111. In other examples, the capacitors C1, C2 and the inductor L1 are integrated into the PMIC 111. The output of the power supply circuit 111 is the supply voltage VD, which is sent to an input port 130 of the RF circuit 121 to power the RF circuit 121.

Still referring to FIG. 3, the RF circuit 121 implements RF-related functions, such as transmitting and receiving RF signals, and may include various functional blocks for processing analog signals and digital signals. The RF circuit 121 may be implemented as an IC, such as a monolithic microwave integrated circuit (MMIC). Examples of the functional blocks of the RF circuit 121 are discussed hereinafter with reference to FIG. 4A. FIG. 3 further illustrates a transmit antenna 123T and a receive antenna 123R coupled to the RF circuit 121 for transmitting and receiving RF signals, respectively. Note that the types (e.g., transmitting, receiving) of antennas and the number of antennas illustrated in FIG. 3 are for illustration purpose and non-limiting.

Due to the spurious components (e.g., the harmonic frequency components) in the supply voltage VD, and since the supply voltage VD is used to power the RF circuit 121 and may be used as a reference voltage for the RF circuit 121, the spurious components of the supply voltage VD, if left untreated, may cause the internal signals of the RF circuit 121 to also have the harmonic frequency components of the reference frequency $F_{ref}$.

Figure 4A:
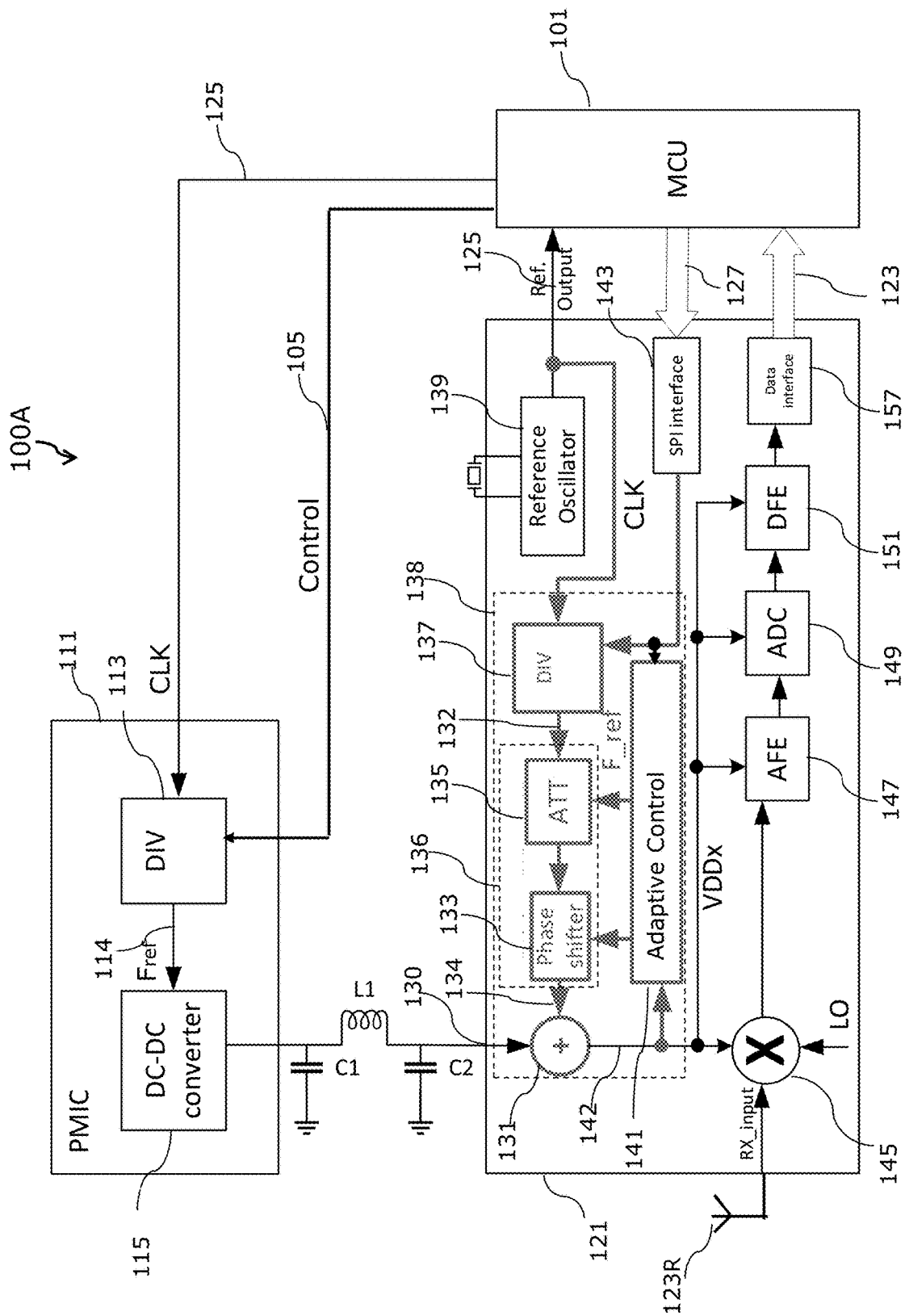
FIG. 4A illustrates a block diagram of a radio frequency (RF) system with a spurious components cancellation circuit, in an example.
Figure 15:
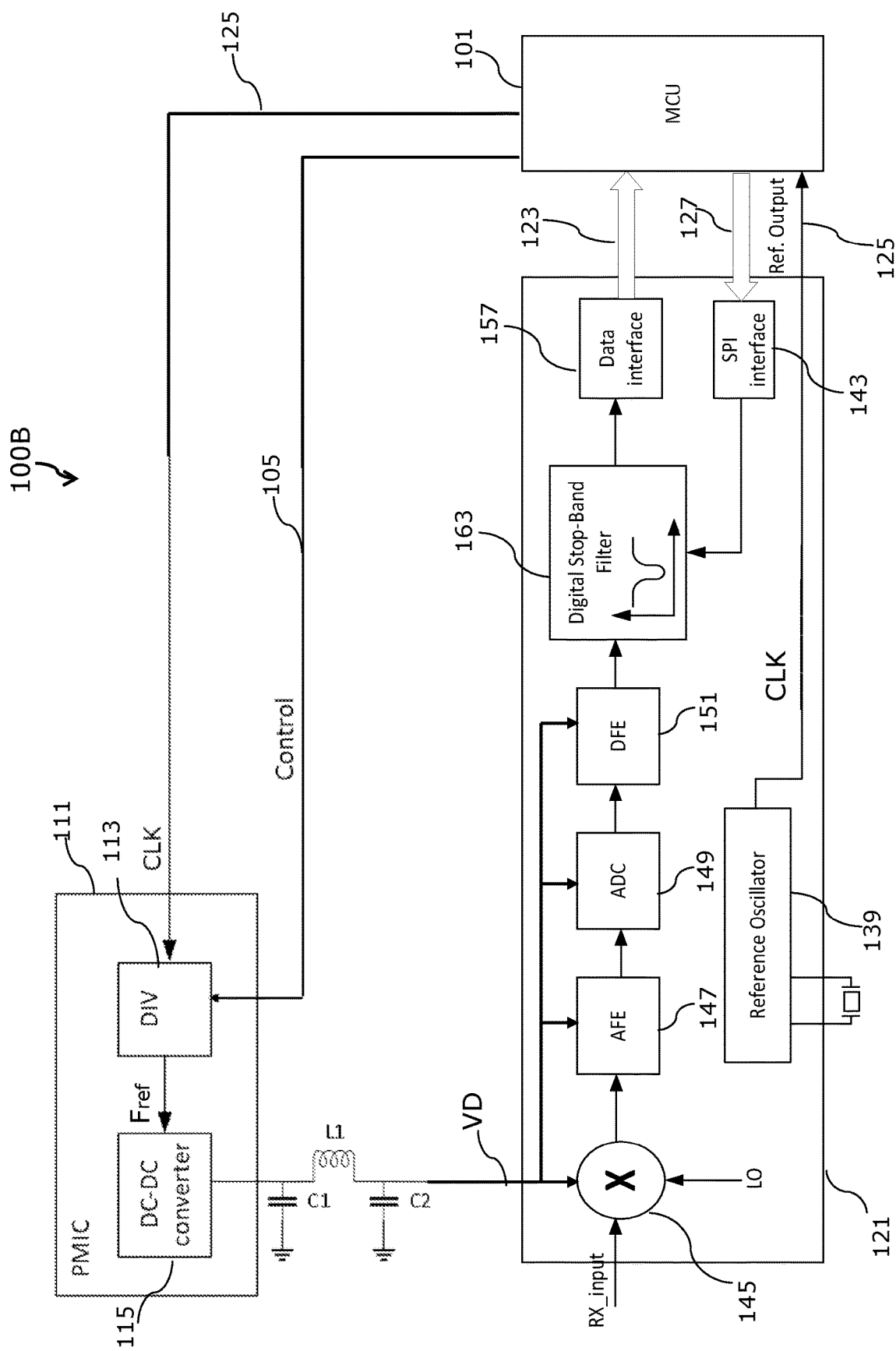
FIG. 15 illustrates a block diagram of a radio frequency (RF) system with a spurious components reduction circuit, in an example.

The spurious components in the internal signals of the RF circuit 121 may cause performance degradation. For example, in the FMCW radar system, the received RF signal is mixed by a mixer with a carrier frequency signal generated by a local oscillator (LO). If a target exists, the received RF signal contains a reflected chirp that is delayed relative to the transmitted chirp. The length of this delay is proportional to the distance between the RF transceiver and the target. Thus, when the received signal is down-converted by the mixer, the output of the mixer includes a beat signal (e.g., a frequency signal, or a tone), and the frequency of the beat signal indicates the distance between the target and the FMCW radar system. The harmonic frequency components, if left untreated, will appear at the output of the mixer as tones at the harmonic frequencies of the reference frequency $F_{ref}$. These tones will appear as "ghost targets" and may produce a FMCW false detection of non-existent targets. The present disclosure discloses various examples (e.g., 100A, 100B) of the RF systems 100, where the RF circuit 121 includes a spurious components reduction circuit (also referred to as harmonics reduction circuit) for reducing the harmonic frequency components of the reference frequency. For example, FIG. 4A illustrates an example RF system 100A where the RF circuit 121 has a spurious components cancellation circuit 138 that cancels the spurious components in the supply voltage VD. FIG. 15 illustrates an example RF system 100B where the RF circuit 121 has a spurious components reduction circuit 163 for filtering out one or more harmonic frequency components from the digital samples of the received RF signal. Details are discussed hereinafter.

FIG. 4A illustrates a block diagram of a radio frequency (RF) system 100A with a spurious components cancellation circuit 138 in the RF circuit 121, in an example. Note that for simplicity, the RF circuit 121 in FIG. 4A illustrates functional blocks for receiving RF signals, and functional blocks for transmitting RF signals are omitted.

In FIG. 4A, the RF circuit 121 includes an oscillator circuit 139 for generating the clock signal 125, which is sent to the power supply circuit 111 (e.g., via the controller 101). The clock signal 125 is also sent to the spurious components cancellation circuit 138. The spurious components cancellation circuit 138 includes a frequency divider 137, an adjustment circuit 136, a coupling circuit 131, and an adaptive control circuit 141 (also referred to as a control circuit 141).

Through the digital interface 143 of the RF circuit 121, the frequency divider 137 receives the value from the controller 101 that indicates the frequency dividing factor. Note that the same value indicating the frequency dividing factor is sent from the controller 101 to both the power supply circuit 111 and the RF circuit 121. In other words, the frequency dividing factors for the frequency divider 137 of the RF circuit 121 and for the frequency divider 113 of the power supply circuit 111 are the same and are updated synchronously (e.g., at the same time). The frequency divider 137 then divides the clock signal 125 to generate a clock signal 132. The clock signal 132 has the same frequency $F_{ref}$ as the reference clock signal 114 in the power supply circuit 111.

Figure 9:
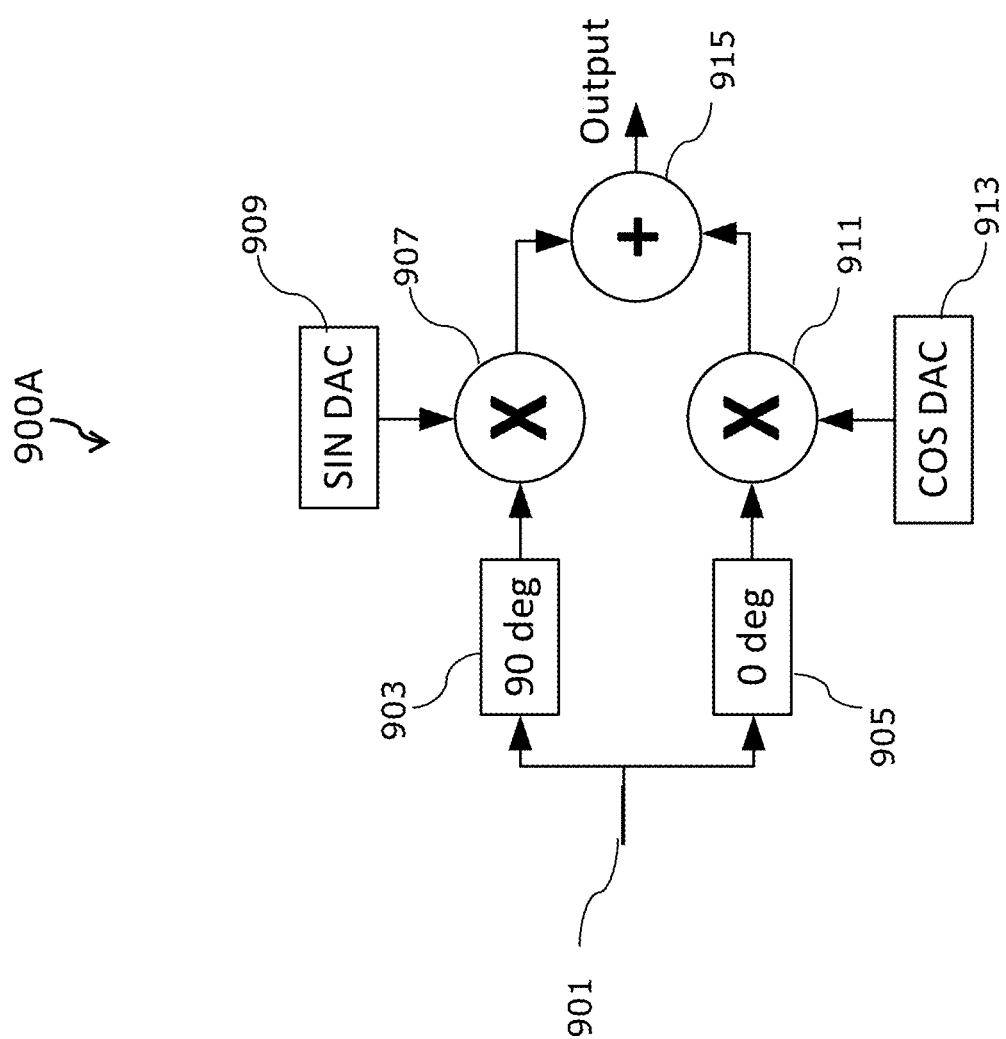
FIG. 9 illustrates a block diagram of a phase shifter, in an example.

The clock signal 132 is sent to the adjustment circuit 136, which includes an attenuator 135 and a phase shifter 133. The attenuator 135 is configured to change the gain (e.g., the amplitude) of the clock signal 132 by adjusting the gain of the attenuator 135. The attenuator 135 may be, e.g., an amplifier with an adjustable (e.g., programmable) gain. The phase shifter 133 is configured to change a phase value of the clock signal 132. Examples of the phase shifter 133 are discussed below with reference to FIGS. 9 and 10. In the example of FIG. 4A, the attenuator 135 is coupled to the output of the frequency divider 137, and the phase shifter 133 is coupled to the output of the attenuator 135. This is, of course, merely a non-limiting example. The locations of the attenuator 135 and the phase shifter 133 in the adjustment circuit 136 may be swapped, for example. As another example, the attenuator 135 and the phase shifter 133 may be combined in one block as shown in FIG. 9 and the discussion thereof.

In the illustrate example, the gain of the attenuator 135 and the phase value of the phase shifter 133 are adjustable (e.g., programmable), and are controlled by the adaptive control circuit 141. Therefore, under the control of the adaptive control circuit 141, the adjustment circuit 136 adjusts the gain (e.g., the amplitude) and the phase of the clock signal 132 to generate a compensation signal 134 at the output of the adjustment circuit 136. The compensation signal 134 tracks the amplitude and the phase of one or more harmonic frequency components of the reference frequency, and is used to cancel out the one or more harmonic frequency components of the reference frequency in the supply voltage VD received at the input port 130 of the RF circuit 121. Details of the adaptive control circuit 141 are discussed below with reference to FIGS. 4B, 6, 7, and 8.

Figure 5:
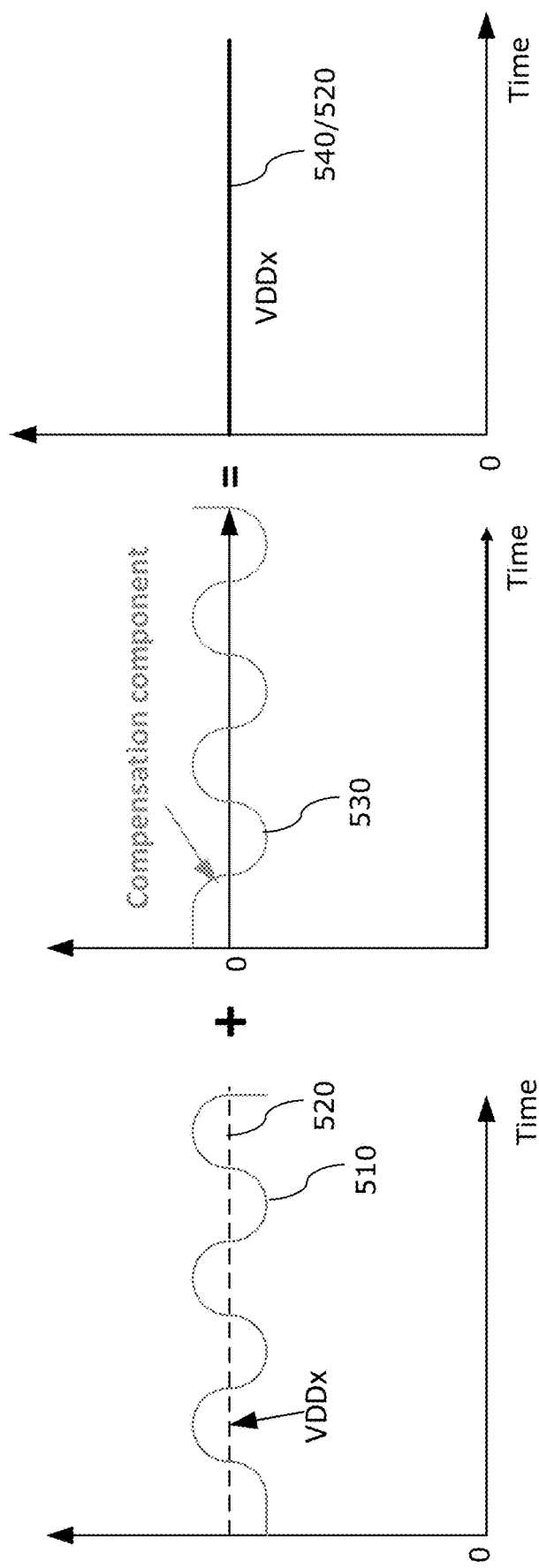
FIG. 5 illustrates cancellation of a harmonic frequency component using a compensation signal, in an example.

Referring temporarily to FIG. 5, which illustrates cancellation of a harmonic frequency component using a compensation signal. In FIG. 5, the subplot on the left shows a signal 510 that oscillates around a DC component 520. The signal 510 may represent a supply voltage from a DC-DC converter that includes a DC component 520 and a periodic component (e.g., a harmonic frequency component at the DC-DC switching frequency). The subplot in the middle shows a compensation signal 530 that is periodic and oscillates around zero. The compensation signal 530 has substantially the same amplitude as the periodic component of the signal 510, but is 180 degrees out of phase with the periodic component of the signal 510. The subplot on the right shows a signal 540, which is equivalent to the sum of the signal 510 and the compensation signal 530. As illustrated in FIG. 5, the signal 540 only includes the DC component 520, since the harmonic frequency component in the signal 510 is cancelled out by the compensation signal 530.

Referring back to FIG. 4A, the compensation signal 134 from the adjustment circuit 136 is added to the supply voltage at the input port 130 by a coupling circuit 131, and a modified supply voltage 142 is generated at the output of the coupling circuit 131. The modified supply voltage 142 has reduced frequency components at one or more harmonic frequencies of the reference frequency. The modified supply voltage 142 is then used to power other functional blocks of the RF circuit 121, such as, for example, the mixer 145, the analog front-end (AFE) circuit 147, the analog-to-digital converter (ADC) 149, and the digital front-end (DFE) circuit 151.

As illustrated in FIG. 4A, the mixer 145 mixes the received RF signal with an LO signal (e.g., a carrier frequency signal) generated by a local oscillator (LO). The output of the mixer 145 is sent to the AFE circuit 147, which may include circuits such as low-noise amplifier (LNA) and analog filter (e.g., low-pass filter or band-pass filter for noise reduction and anti-aliasing purpose). The output of the AFE circuit 147 is then converted to digital samples by the ADC 149. The output of the ADC 149 is then sent to the DFE circuit 151, which may include, e.g., one or more digital filters to process the digital samples. The output of the DFE circuit 151 is then sent to the controller 101 via the digital interface 157. The controller 101 may process the digital samples for target detection. Since the modified supply voltage 142 has reduced harmonic frequency components, the digital samples sent to the controller 101 are cleaner (e.g., with less or no harmonic frequency components), which in turn improves the system performance by, e.g., reducing false alarm of the radar system.

Figure 4B:
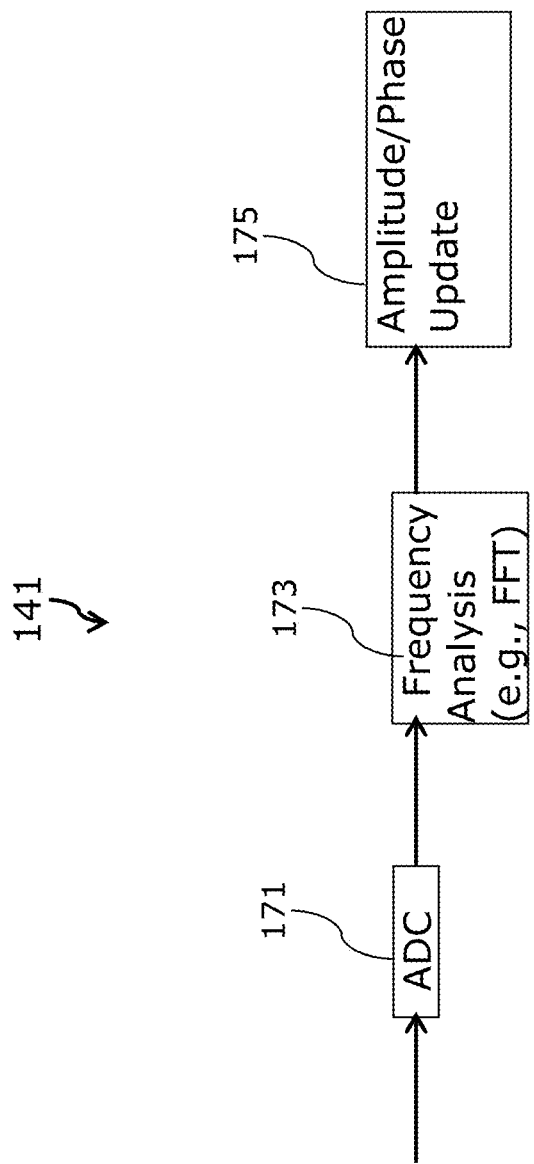
FIG. 4B illustrates a block diagram of an adaptive control circuit of the spurious components cancellation circuit of FIG. 4A, in an example.
Figure 6:
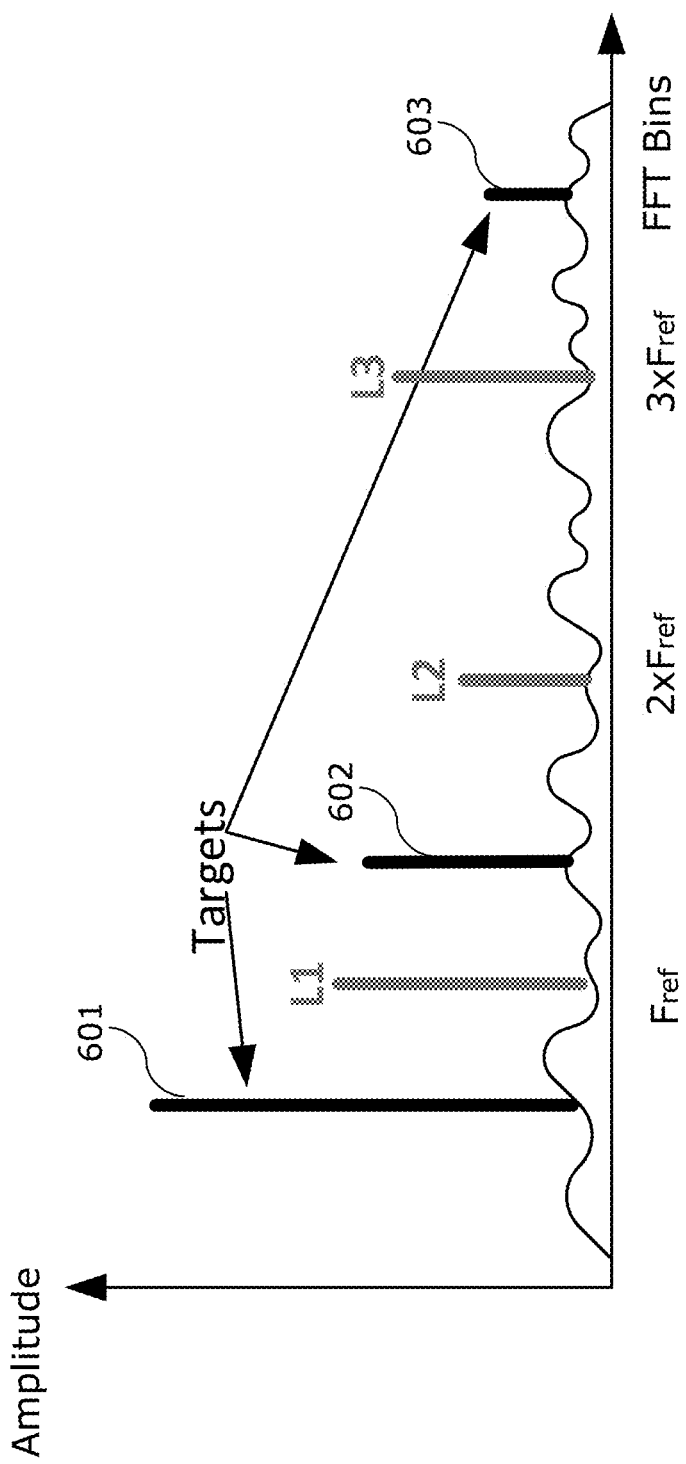
FIG. 6 illustrates the frequency components of a received signal of a FMCW radar system with spurious components, in an example.

FIG. 4B illustrates a functional block diagram of the adaptive control circuit 141 of FIG. 4A, in an example. Note that for simplicity, not all functional blocks are illustrated in FIG. 4B. As illustrated in FIG. 4B, the adaptive control circuit 141 includes an ADC 171, a frequency analysis block 173, and an amplitude/phase update block 175. In some examples, the ADC 171 generates N digital samples of the output of the coupling circuit 131. The N digital samples are then processed by the frequency analysis block 173, which performs a frequency analysis of the N digital samples, e.g., by performing a Fast Fourier transform (FFT) of the N digital samples. The frequency analysis block 173 may be a stand-alone FFT circuit, or may be implemented together with the amplitude/phase update block 175 (e.g., in a processor), as examples. FIG. 6 illustrates an example of the output of the FFT of the N digital samples, before the harmonic frequency components are cancelled out.

Referring temporarily to FIG. 6, the X-axis represents the frequency bins of the FFT output (also referred to FFT bins), and the Y-axis represents the amplitude of the frequency component in each FFT bin. In the example of FIG. 6, three FFT bins have large frequency components, labeled as 601, 602, and 603, which may indicate three targets at three different distances from the radar. FIG. 6 also illustrates three spurious components, labeled as L1, L2, and L3, in some FFT bins. These spurious components are at the first three harmonic frequencies of the reference frequency $F_{ref}$ (e.g., $F_{ref}$, $2 \times F_{ref}$, and $3 \times F_{ref}$). These spurious components, if not reduced or removed, may appear as "ghost targets" to the FMCW radar system. As will be discussed in more details hereinafter, the adaptive control circuit 141 forms a closed control loop with the adjustment circuit 136, and updates the gain and the phase value of the adjustment circuit 136 in an iterative manner to find the optimum or near-optimum values for the gain and the phase values, such that one or more harmonic frequency components are reduced.

Referring back to FIG. 4B, output of the frequency analysis block 173 (e.g., output of FFT of the N digital samples) is sent to the amplitude/phase update block 175. The amplitude/phase update block 175 may be or include a processor, such as a micro-controller or a digital signal processor. An adaptation algorithm runs on the processor for updating the weight of the attenuator 135 and the phase value of the phase shifter 133, in some examples. Details of the adaptation algorithm of the adaptive control circuit 141 are discussed hereinafter with reference to FIGS. 7 and 8.

In some examples, the amplitude/phase update block 175 measures the harmonic frequency components in the N digital samples by selecting frequency components in FFT bins that correspond to the harmonics of the reference frequency, and by calculating a weighted sum of the selected frequency components. For example, for the FFT output illustrated in FIG. 6, the weight sum S may be calculated by $S = \Sigma_m w_m L_m$, where m=1, 2, 3, ..., N, where N is the number of harmonic frequencies to include in the weight sum S, $L_m$ is the amplitude of the frequency component in the FFT bin corresponding to the m-th harmonic frequency, and $w_m$ is the weight factor for the m-th harmonic frequency. The weight factors $w_m$ are user programmable, and can be assigned any suitable value between 0 and 1 to achieve different performance target. For example, the lower harmonic frequencies may be assigned larger weight factors $w_m$ than the higher harmonic frequencies. As another example, some of the weight factor may be assigned zero values, which effectively excludes the corresponding harmonic frequencies from the calculation of the weighted sum S. Further, instead of using the amplitude of the harmonic frequencies, the weighted sum S may be calculated using squares of the amplitudes of the harmonic frequencies, e.g., $S=\Sigma_m w_m L_m^2$, which measures the power of the harmonic frequency components.

In some examples, the weighted sum S is used as a cost function for the adaptation algorithm of the adaptive control circuit 141. In other words, the goal of the adaptation algorithm of the adaptive control circuit 141 is to find the optimum or near-optimum values for the amplitude of the attenuator 135 and the phase value of the phase shifter 133, such that the weighted sum S is minimized or at a near-minimum value.

Figure 7:
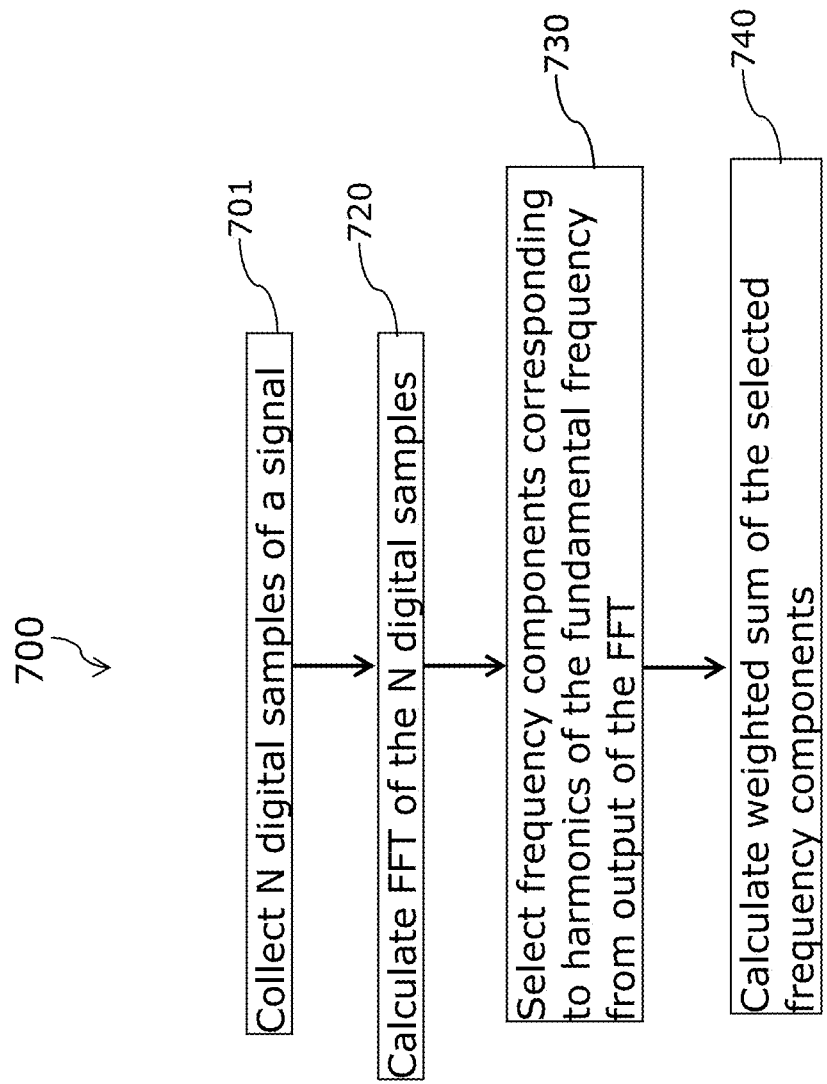
FIG. 7 illustrates a flow chart of a method for measuring the harmonic frequency components in a signal, in an example.

FIG. 7 shows a flow chart of a method for measuring the harmonic frequency components of a fundamental frequency (e.g., the reference frequency $F_{ref}$) in a signal, in an example. The method in FIG. 7 is the same as or similar to the method discussed above for calculating the weighted sum S, thus details are not repeated. To facilitate discussion of FIG. 8, the processing steps illustrated in FIG. 7 are denoted as a function HarMeasure( ) in FIG. 8.

Figure 8:
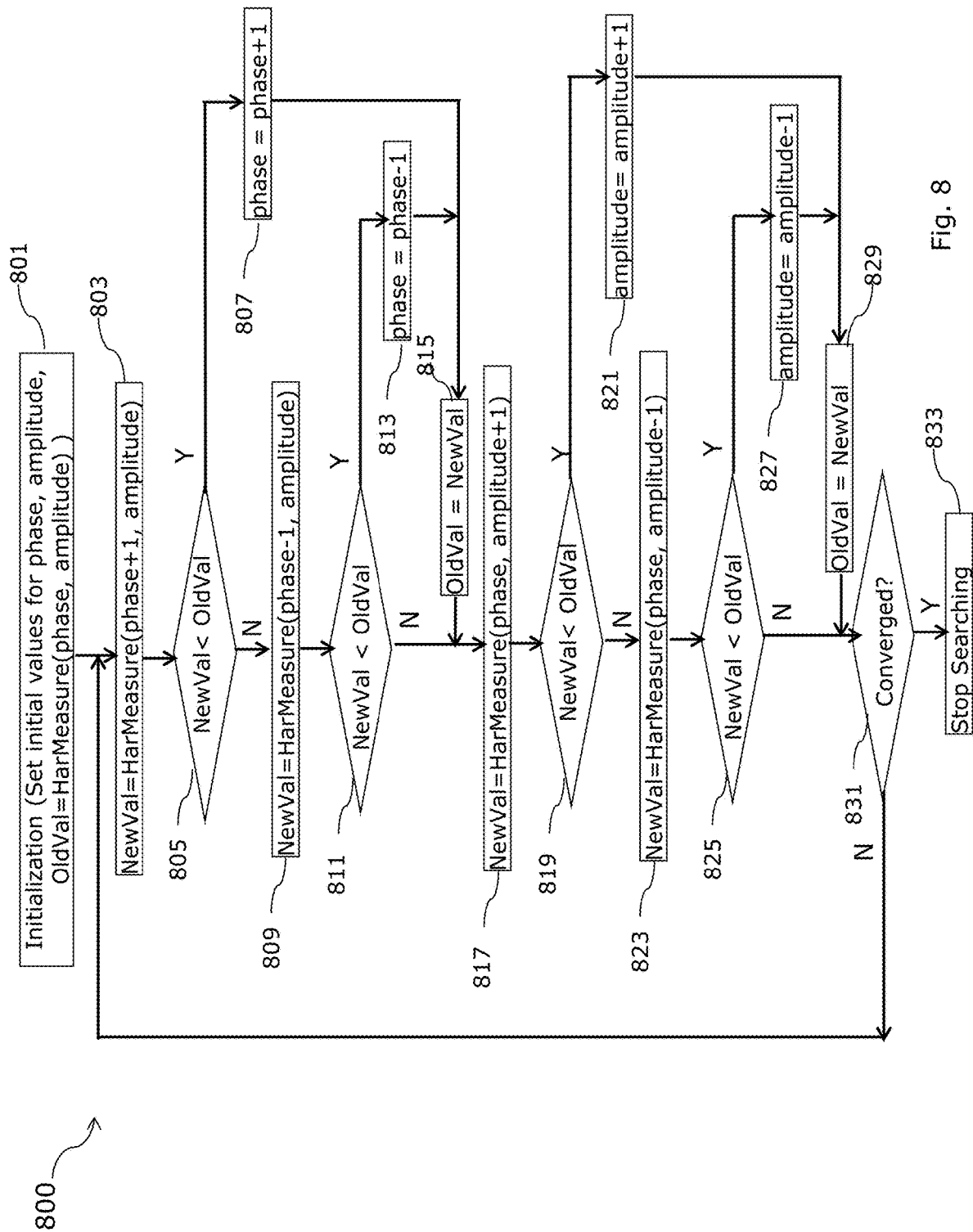
FIG. 8 illustrates a flow chart of a method for updating the amplitude and the phase of the spurious components cancellation circuit of FIG. 4A, in an example.

FIG. 8 illustrates a flow chart of a method 800 for updating the amplitude and the phase of the adjustment circuit 136 of FIG. 4A, in an example. The method 800 is used as the adaptation algorithm of the adaptive control circuit 141, in some examples. The adaptation algorithm illustrated in FIG. 8 is an iterative algorithm. The adaptation algorithm starts by assigning initial values for the amplitude and the phase value of the adjustment circuit 136, then proceeds in an iterative manner. In each iteration, the adaptation algorithm searches for a better amplitude value and a better phase value for the adjustment circuit 136 that reduces the measurement of the harmonic frequency components. The adaptation algorithm continues until convergence is achieved, e.g., when no improvement is achieved between adjacent iterations. The adaptation algorithm may also stop when a user-defined maximum number of iterations is reached.

In the example of FIG. 8, during each iteration, the adaptation algorithm searches for a better phase value by temporarily increasing/decreasing the current phase value by a pre-determined step size while keeping the amplitude unchanged; making a new measurement of the harmonic frequency components with the temporarily increased/decreased phase value; and comparing an "old value" OldVal (from measurement of the harmonic frequency components using the current amplitude/phase values) with a "new value" NewVal from the new measurement. If the new measurement is better (e.g., NewVal<OldVal), then the current phase value is updated with the temporary new phase value that achieves the better new measurement, and the OldVal is updated with the NewVal. Next, the adaptation algorithm searches for a better amplitude value by temporarily increasing/decreasing the current amplitude value by a pre-determined step size while keeping the phase value unchanged; making a new measurement of the harmonic frequency components with the temporarily increased/decreased amplitude value; and comparing the OldVal with the NewVal of the new measurements. If the new measurement is better (e.g., NewVal<OldVal), then the current amplitude value is updated with the temporary new amplitude value that achieves the better new measurement, and the OldVal is updated with the NewVal. Details of the method 800 are discussed below.

Referring to FIG. 8, in block 801, the method 800 starts by setting initial values for the gain (also referred to as the amplitude) of the attenuator 135 and phase value of the phase shifter 133 of the adjustment circuit 136. For example, the initial value for the amplitude of the attenuator 135 may be set as 1, and the initial phase value for the phase shifter may be 0. The method 800 then performs a measurement of the harmonic frequency components with the current amplitude value (e.g., amplitude=1) and the current phase value (e.g., phase=0), using the method 700 of FIG. 7. In other words, the N digital samples are collected with the amplitude of the attenuator 135 and the phase value of the phase shifter 133 set to the current values, and the measurement of the harmonic frequency components (e.g., the weighted sum S of the harmonic frequency components) is assigned as an "old value" (denoted as OldVal).

Next, in block 803, a new measurement of the harmonic frequency components is made with a temporary new phase value for the phase shifter 133 while the amplitude of the attenuator 135 is kept unchanged, where the temporary new phase value is the current phase value incremented by a pre-determined step size (denoted as "phase=phase+1" in block 803). The value of the new measurement is assigned as the new value NewVal.

Next, in block 805, the NewVal is compared with the OldVal. If the NewVal is smaller than the OldVal, this indicates that the new temporary phase value results in reduced harmonic frequency components. Therefore, a better phase value is found, and the current phase value is updated with the new temporary phase value (e.g., phase=phase+1), as illustrated in block 807, and the OldVal is updated with the NewVal calculated with the new temporary phase value, as illustrated in block 815.

If, however, the NewVal is not smaller than the Old Val in block 805, this indicates that increasing the current phase value by the pre-determined step size did not reduce the harmonic frequency components. The method continues by searching the phase value in the opposite direction. In particular, in block 809, a new measurement of the harmonic frequency components is performed using a temporary new phase value for the phase shifter 13, while the amplitude of the attenuator 135 is kept unchanged, where the temporary new phase value is the current phase value decremented by a pre-determined step size (denoted as "phase=phase−1" in block 809). The value of the new measurement is assigned as the new value NewVal.

Next, in block 811, the NewVal is compared with the OldVal. If the NewVal is smaller than the OldVal, this means decreasing the phase value by the pre-determined step-size results in reduced harmonic frequency components. Therefore, a better phase value is found, and the current phase value is updated with the new temporary phase value (e.g., phase=phase−1), as illustrated in block 813, and the OldVal is updated with the NewVal calculated with the new temporary phase value, as illustrated in block 815.

If, however, the NewVal is not smaller than the Old Val in block 811, this indicates that decreasing the current phase value by the pre-determined step size did not reduce the harmonic frequency components, either. Therefore, the search for a better phase value in the current iteration is finished, and current phase value is left unchanged.

Next, the method proceeds to search for a better amplitude value. In block 817, a new measurement of the harmonic frequency components is performed using a temporary new amplitude value for the attenuator 135, while the phase value of the phase shifter 133 is kept unchanged, where the temporary new amplitude value is the current amplitude value incremented by a pre-determined step size (denoted as "amplitude=amplitude+1" in block 817). The value of the new measurement is assigned as the new value NewVal.

Next, in block 819, the NewVal is compared with the OldVal to determine whether the temporary new amplitude value reduces the harmonic frequency components. If it does, then a better amplitude value is found, the current amplitude value is updated (see "amplitude=amplitude+1" in block 821), and the OldVal is updated with the NewVal, as illustrated in block 829.

If, however, the NewVal is not smaller than the OldVal, the adaptation algorithm searches in the other direction. In particular, a new measurement of the harmonic frequency components is performed using a temporary new amplitude value for the attenuator 135, while the phase value of the phase shifter 133 is kept unchanged, where the temporary new amplitude value is the current amplitude value decremented by a pre-determined step size (denoted as "amplitude=amplitude−1" in block 823). The value of the new measurement is assigned as the new value NewVal in block 823.

Next, in block 825, the NewVal is compared with the OldVal to determine whether the temporary new amplitude value reduces the harmonic frequency components. If it does, then a better amplitude value is found, the current amplitude value is updated (see "amplitude=amplitude−1" in block 827), and the OldVal is updated with the NewVal, as illustrated in block 829.

If, however, the NewVal is not smaller than the Old Val in block 825, this indicates that decreasing the current amplitude value by the pre-determined step size did not reduce the harmonic frequency components, either. Therefore, the search for a better amplitude value in the current iteration is finished, and current amplitude value is left unchanged.

Next, in block 831, the method 800 checks if convergence has been achieved. For example, if between two adjacent iterations, no reduction in the measurement of the harmonic frequency components is achieved, then convergence is achieved and the adaptation algorithm ends. Note that the adaptation algorithm of FIG. 8 searches for a better phase value first, then searches for a better amplitude value in each iteration. This is, of course, merely a non-limiting example. One skilled in the art will readily appreciate that it is possible to modify the method 800, such that the adaptation algorithm searches for a better amplitude value first, then searches for a better phase value in each iteration. These and other variations are fully intended to be included within the scope of the present disclosure.

FIG. 9 illustrates a block diagram of a phase shifter 900, in an example. The phase shifter is an analog shifter and may be used as the phase shifter 133 in FIG. 4A, in some examples. The phase shifter 900A includes an input terminal 901 for accepting an input clock signal (e.g., a cosine wave signal). The input of the phase shifter 900A is split into two paths, where a first path is sent to a first shifting element 905 which introduces 0 degree phase shift, and the second path is sent to a second shifting element 903 which introduces a 90 degree phase shift. The output of the first shifting element 905 is multiplied with the output of a first digital-to-analog converter (DAC) 913 by a first multiplier 911, and the output of the second shifting element 903 is multiplied with the output of a second DAC 909 by a second multiplier 907, where the first DAC 913 converts the value $\cos(\theta)$ into an analog signal, and the second DAC 909 converts the value $\sin(\theta)$ into an analog signal, where the phase $\theta$ is the desired phase delay (e.g., a user programmable value) for the phase shifter 900. The output of the first multiplier 911 and the output of the second multiplier 907 are added together by an adder circuit 915 to generate the output of the phase shifter 900A. Note that the phase shifter 900 may also be used for amplitude adjustment (e.g., gain adjustment) for the input signal at the input terminal 901, when the gain of the first DAC 913 and the gain of the second DAC 909 are adjusted together (e.g., contain a same gain adjustment factor).

Figure 10:
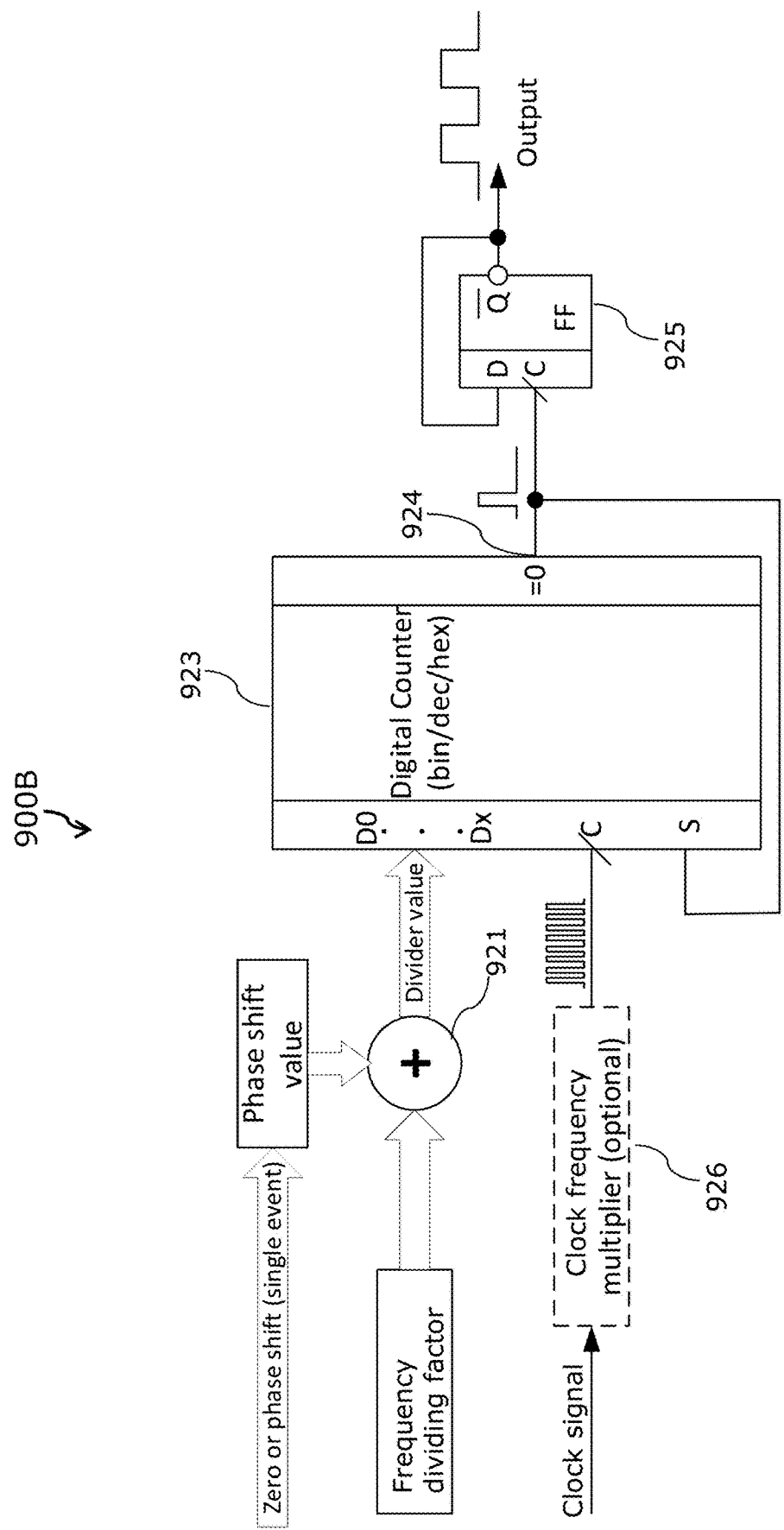
FIG. 10 illustrates a block diagram of a phase shifter, in another example.

FIG. 10 illustrates a block diagram of a phase shifter 900B, in another example. The phase shifter is a digital shifter, and may be used as the phase shifter 133 in FIG. 4A, in some examples. Note that in examples where the phase shifter 900B is used in the spurious components cancellation circuit 138 of FIG. 4A, the phase shifter 900B is integrated with the frequency divider 137 in a same circuit. In other words, the phase shifter 900B functions both as the frequency divider 137 and the phase shifter 133 of FIG. 4A.

In the example of FIG. 10, the phase shifter 900B includes a digital counter 923. The digital counter 923 is driven by a clock signal supplied at a clock input terminal C. The digital counter 923 is configured to count down from an initial value (also referred to as a divider value) to a terminal value (e.g., zero), and is configured to generate a pulse at an output port 924 when the digital counter 923 counts down to the terminal value. The initial value is loaded into the digital counter 923 through an input interface labeled D0–Dx in FIG. 10 by an enable signal applied at an input port S, which input port S is connected to the output port 924. Therefore, when the digital counter 923 counts down to the terminal value (e.g. zero), a pulse is generated at the output port 924, and the pulse functions as the enable signal to load the initial value into the digital counter 923 again, and the digital counter 923 starts counting again.

Still referring to FIG. 10, the initial value loaded into the input interface is the output of an adder 921, which adds a frequency dividing factor with a phase shift value to generate the initial value loaded into the digital counter 923. In FIG. 10, the frequency dividing factor indicates the ratio between the frequency of the clock signal applied at the clock input terminal C and the nominal output frequency of the digital counter 923. The phase shift value indicates a desired phase shift in the output pulse signal at the output poll 924. In some examples, to maintain a constant phase for the output pulse signal at the output poll 924, the phase shift value remains zero. A one-time change in the phase shift value causes a one-time phase change in the output pulse signal, which is illustrated in FIG. 11.

Figure 11:
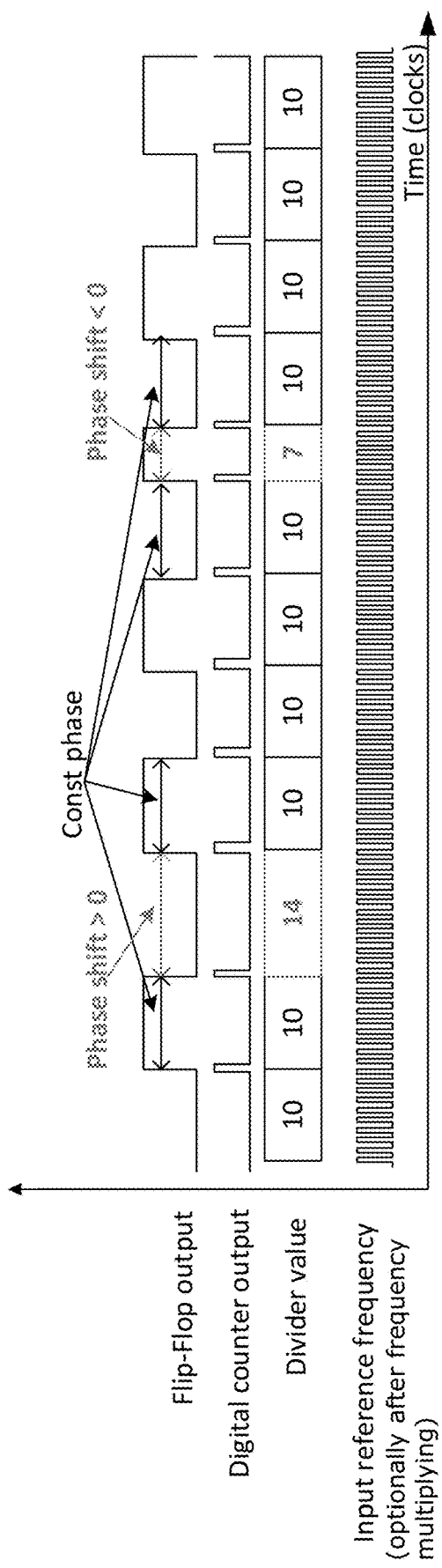
FIG. 11 illustrates a timing diagram of a digital counter of the phase shifter of FIG. 10, in an example.

Referring temporarily to FIG. 11, which illustrates a timing diagram of the digital counter 923 of FIG. 10, in an example. In FIG. 11, the input clock signal is plotted at the bottom of the figure, and the frequency dividing factor is ten. Therefore, the digital counter output (the pulse signal at the output port 924) is generated once every 10 input clock cycles, when the phase shift value is zero. In the example of FIG. 11, the phase shift value changed to a non-zero value twice, e.g., having a non-zero value of 4 and −3, respectively. As a result, the divider value to change to 14 and 7, respectively. The larger divider value of 14 caused a positive phase shift, e.g., the output pulse appeared later than normal (e.g., when the phase shift value is zero), and the smaller divider value 7 caused a negative phase shift, e.g., the output pulse appeared earlier than normal.

Referring back to FIG. 10, the phase shifter 900B may further include a flip-flop 925. The output port 924 of the digital counter 923 is connected to an input port C of the flip-flop as an enable signal or a clock signal for the flip-flop. The inverted output port $\overline{Q}$ of the flip-flop 925 is connected to the data input port D of the flip-flop 925. The flip-flop 925 converts a series of narrow pulses at the output port 924 of the digital counter 923 into an output clock signal with a 50% duty cycle. The frequency of the output signal of the phase shifter 900B, which is at the inverted output port $\overline{Q}$ of the flip-flop 925, is half of the frequency of the pulse signal at the output port 924 of the digital counter 923. To compensate for the frequency reduction, the frequency of the clocks signal may be multiplied (e.g., by two) by a clock frequency multiplier 926. By multiplying the clock signal frequency by a factor, the clock frequency multiplier 926 may allow increase resolution for the phase delay of the phase shifter 900B. For example, by doubling the clock signal frequency, the amount of phase shift in the output pulse that corresponds to a numeric value of "1" for the phase shift value is reduced by half.

Figure 12:
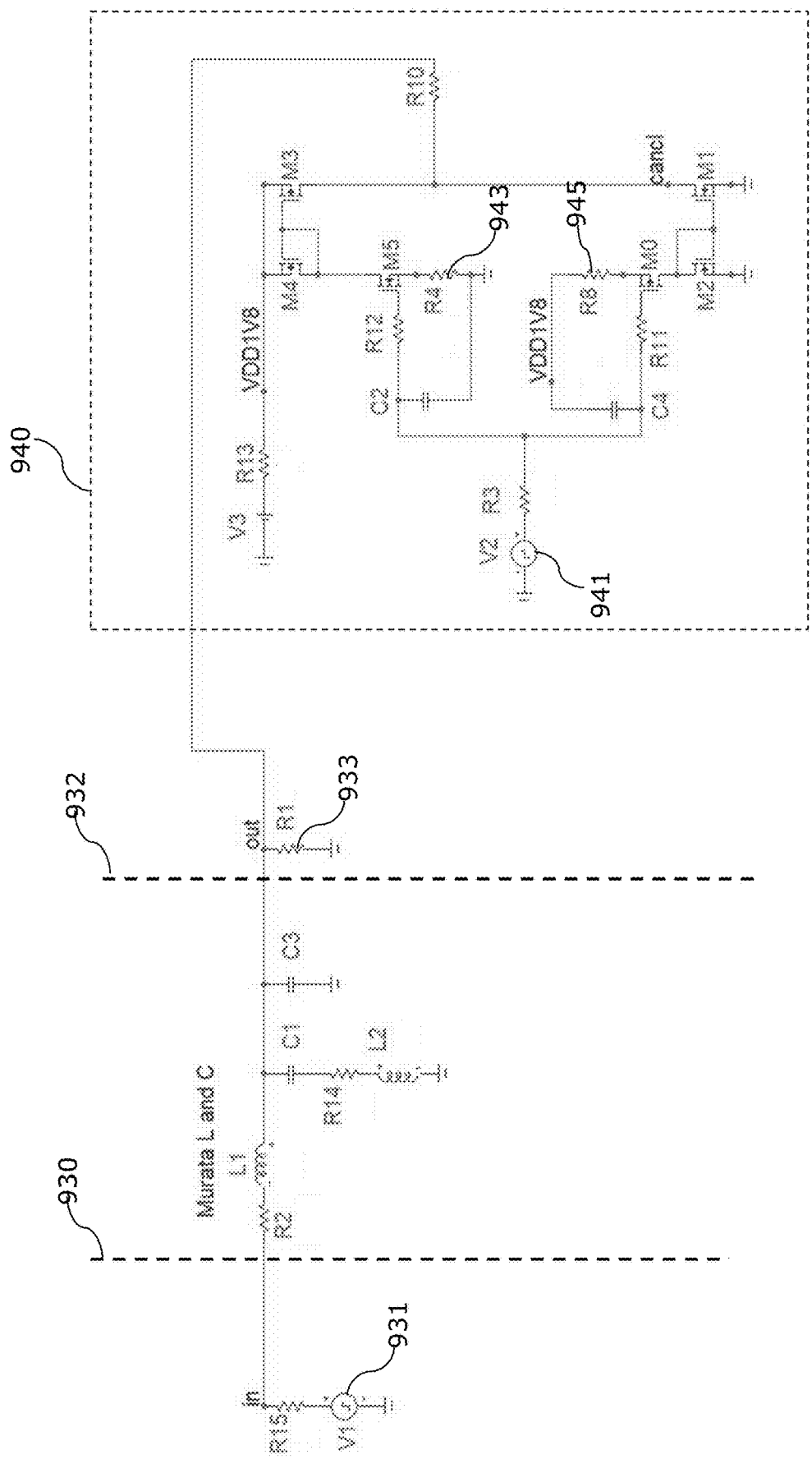
FIG. 12 illustrates a schematic diagram of a system with a spurious components cancellation circuit, in an example.
Figure 13A:
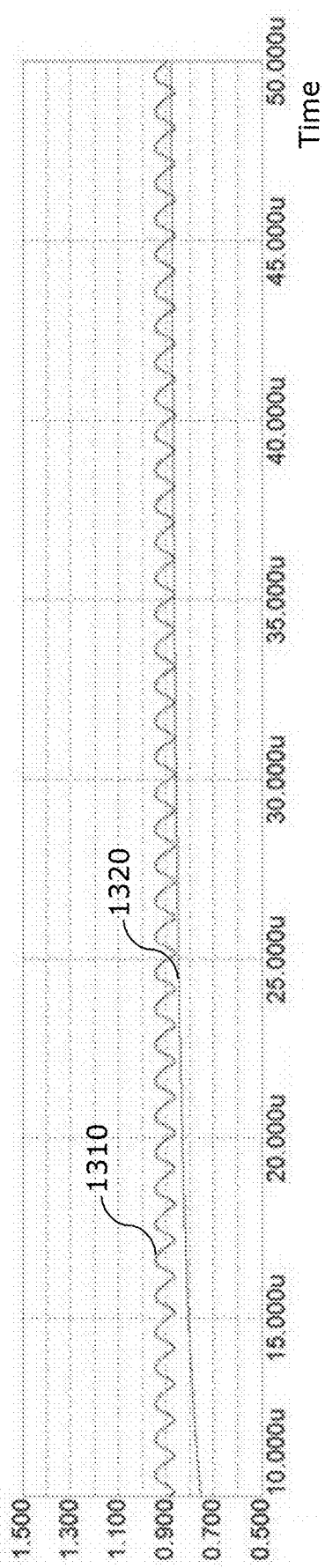
FIGS. 13A and 13B illustrate the input signal to the spurious components cancellation circuit of FIG. 12 in time domain and frequency domain, respectively, in an example.
Figure 13B:
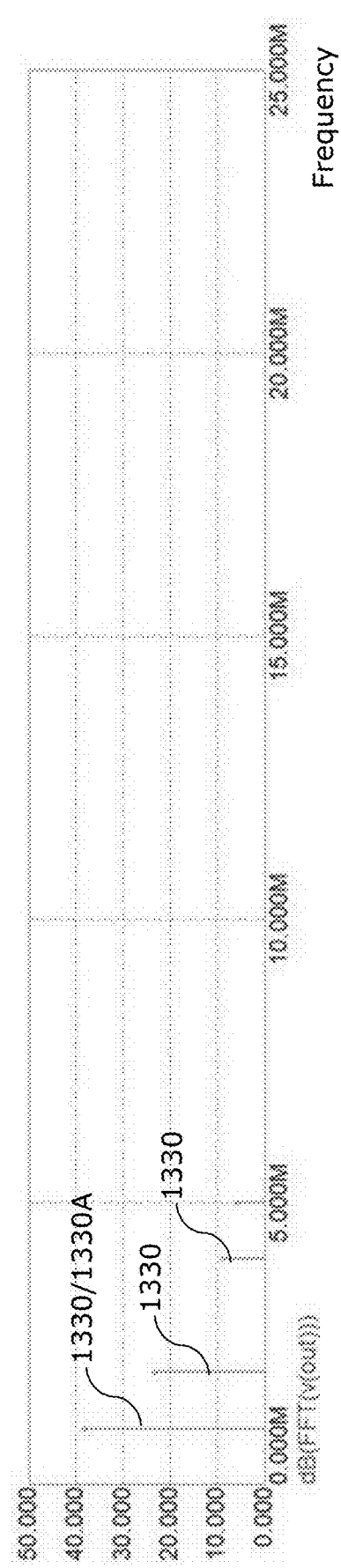

FIG. 12 illustrates a schematic diagram of a system with a spurious components cancellation circuit, in an example. The system of FIG. 12 is used in simulation to validate the adaptation algorithm illustrated in FIG. 8. In FIG. 12, a voltage source 931 and a resistor R15 represent the power supply that generates a voltage signal that includes a DC component and harmonic frequency components of a reference frequency. FIGS. 13A and 13B illustrate the voltage signal generated by the voltage source 931 in time domain and frequency domain, respectively. As illustrated in FIG. 13A, the voltage signal includes a DC component 1320 and the harmonic frequency components 1310. The corresponding frequency plot of the voltage signal in FIG. 13B shows a plurality of harmonic frequency components 1330, where the harmonic frequency component 1330A corresponds to the reference frequency (fundamental frequency) component.

Referring back to FIG. 12, the circuit between dashed lines 930 and 932 includes charging components for DC-DC switching (e.g., L1, C1), their equivalent parasitic components (e.g., R2, R14, L2), and an element of a passive lower-pass filter for filtering the voltage signal from the voltage source 931 (e.g., C3). The circuit to the right of the dashed line 932 shows a load 933 (e.g., a resistor to simulate components of an RF system that consume a DC current) and a simplified spurious components cancellation circuit 940, where the simplified spurious components cancellation circuit 940 performs the functions of the coupling circuit 131 and the adjustment circuit 136 of FIG. 4A, and the voltage across the load 933 corresponds to the output voltage of the simplified spurious components cancellation circuit 940. The simplified spurious components cancellation circuit 940 includes a clock signal generator 941, which generates a clock signal having a frequency equal to the switching frequency (e.g., fundamental frequency) of the voltage source 931. The voltage across the clock signal generator 941 and the resistor R3 represents the output of the phase shifter 133 of FIG. 4A. The phase value of the clock signal generated by the clock signal generator 941 is adjustable (e.g., programmable), and the adaptation algorithm of FIG. 8 is used to adjust the adjustable phase value. The simplified spurious components cancellation circuit 940 further includes circuits for adjusting the gain of the clock signal generated by the clock signal generator 941, such as the transistors M0, M1, M2, M3, M4, and M5, and the resistors/capacitors connected to them. For example, by adjusting the resistances of the resistors R4 and R8 (which are adjustable resistors), the gain of the simplified spurious components cancellation circuit 940 is changed. The gain of the simplified spurious components cancellation circuit 940 is adjusted in accordance with the method of FIG. 8.

Figure 14A:
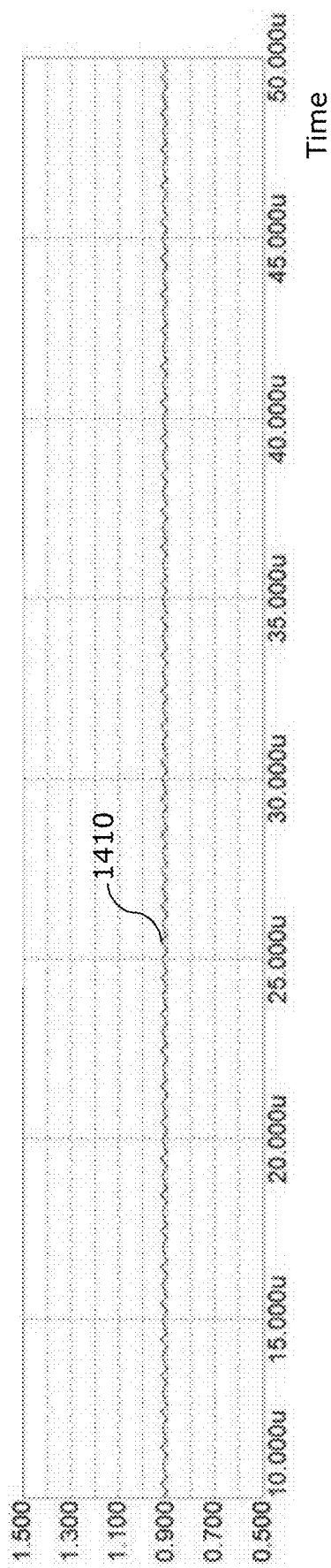
FIGS. 14A and 14B illustrate the output signal of the spurious components cancellation circuit of FIG. 12 in time domain and frequency domain, respectively, in an example.
Figure 14B:
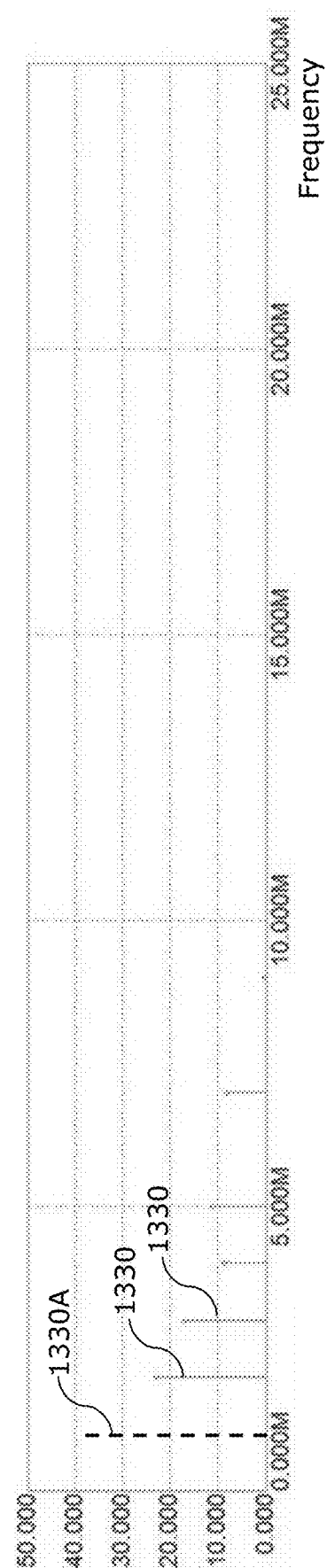

FIGS. 14A and 14B illustrate the output signal of the simplified spurious components cancellation circuit 940 of FIG. 12 in time domain and frequency domain, respectively, in an example. Compared with FIG. 13A, the output signal 1410 in FIG. 14A has significantly reduced harmonic frequency components. FIG. 14B shows the remaining harmonic frequency components 1330 at the output of the simplified spurious components cancellation circuit 940. Noticeably, the harmonic frequency component 1330A at the fundamental frequency is significantly reduced. In FIG. 14B, the dashed line is used to indicate the location of the reduced harmonic frequency component 1330A at the fundamental frequency. In the example of FIGS. 14A and 14B, the weighted sum S used by the adaptation algorithm may have zero values for the weight factors $w_m$ (m=2, 3, ..., N) for the higher order (e.g., $2 \times F_{ref}$, $3 \times F_{ref}$, ..., $N \times F_{ref}$) harmonic frequency components and has a non-zero value (e.g., $w_1 = 1$) for the fundamental frequency harmonic component. This prioritizes the reduction of the harmonic component at the fundamental frequency in the output of the spurious components cancellation circuit. In FMCW radar detection, closer targets correspond to lower frequency tones. The closer targets may be more important to detect, e.g., in FMCW radar in automobile applications. Therefore, by reducing the harmonic component at the fundamental frequency, the detection reliability of close target in FMCW radar system is improved.

When the target location in frequency domain is at or near one of the harmonic frequencies, the spurious components cancellation circuit 138 may attenuate the frequency component corresponding to the target, and may cause the FMCW radar system to miss the target. In some examples, to avoid or reduce the probability of missed detection of the target, the controller 101 sends different frequency dividing factors to the power supply circuit 111 and the RF circuit 121 for use in different frames of the RF signals, such that the harmonic frequencies of the reference frequency change from frame to frame. For example, referring back temporarily to FIGS. 2A and 2B, the controller 101 may send a new (e.g., different) frequency dividing factor to the power supply circuit 111 and the RF circuit 121 during the gap time $T_{gap}$ between frames, such that for each new frame duration $T_{ramp}$, a new reference frequency $F_{ref}$ is used, which in turn causes the harmonics frequencies of the reference frequency to change from frame to frame. Since the spurious components cancellation circuit 138 of FIG. 4A adaptively tracks and cancels the harmonic frequency components, a target that was attenuated by the spurious components cancellation circuit 138 during one frame will not be attenuated by the spurious components cancellation circuit 138 during the next frame. This ensures that the target will be detected in some of the frames. The example above is a non-limiting example, and other variations or modifications are possible and are fully intended to be included within the scope of the present disclosure. For example, the frequency dividing factor may remain the same for a few frames (instead of changing every frame), then change to a new value.

FIG. 15 illustrates a block diagram of a radio frequency (RF) system 100B with a spurious components reduction circuit 163, in an example. In the RF system 100B, the supply voltage VD from the power supply circuit 111 is used to power the mixer 145, the AFE circuit 147, the ADC 149 and the DFE circuit 151. The output of the DFE circuit 151 contains harmonic frequency components of the reference frequency $F_{ref}$. The spurious components reduction circuit 163 is a digital filter that rejects (e.g., attenuates) at least one of the harmonic frequency components. In some examples, the digital filter is a programmable digital filter, such as a programmable finite impulse response (FIR) filter, or a programmable infinite-impulse response (IIR) filter, where the filter coefficients and/or the structure of the digital filter is controlled (e.g., programmed) by, e.g., the frequency dividing factor received from the controller 101. In other words, the digital filter changes its frequency response adaptively in accordance with the frequency dividing factor. In some examples, the spurious components reduction circuit 163 includes, or is coupled to, a memory device (e.g., a non-volatile memory) that stores multiple sets of filter coefficients, where each set of filter coefficients corresponds to a different frequency dividing factor. The frequency dividing factor determines which set of filter coefficients is loaded into the digital filter for spurious components reduction. The digital filter may be a software filter (e.g., implemented as a filtering algorithm running on a processor), or may be a stand-alone filter (e.g., having dedicated hardware components for the filtering function).

Figure 16:
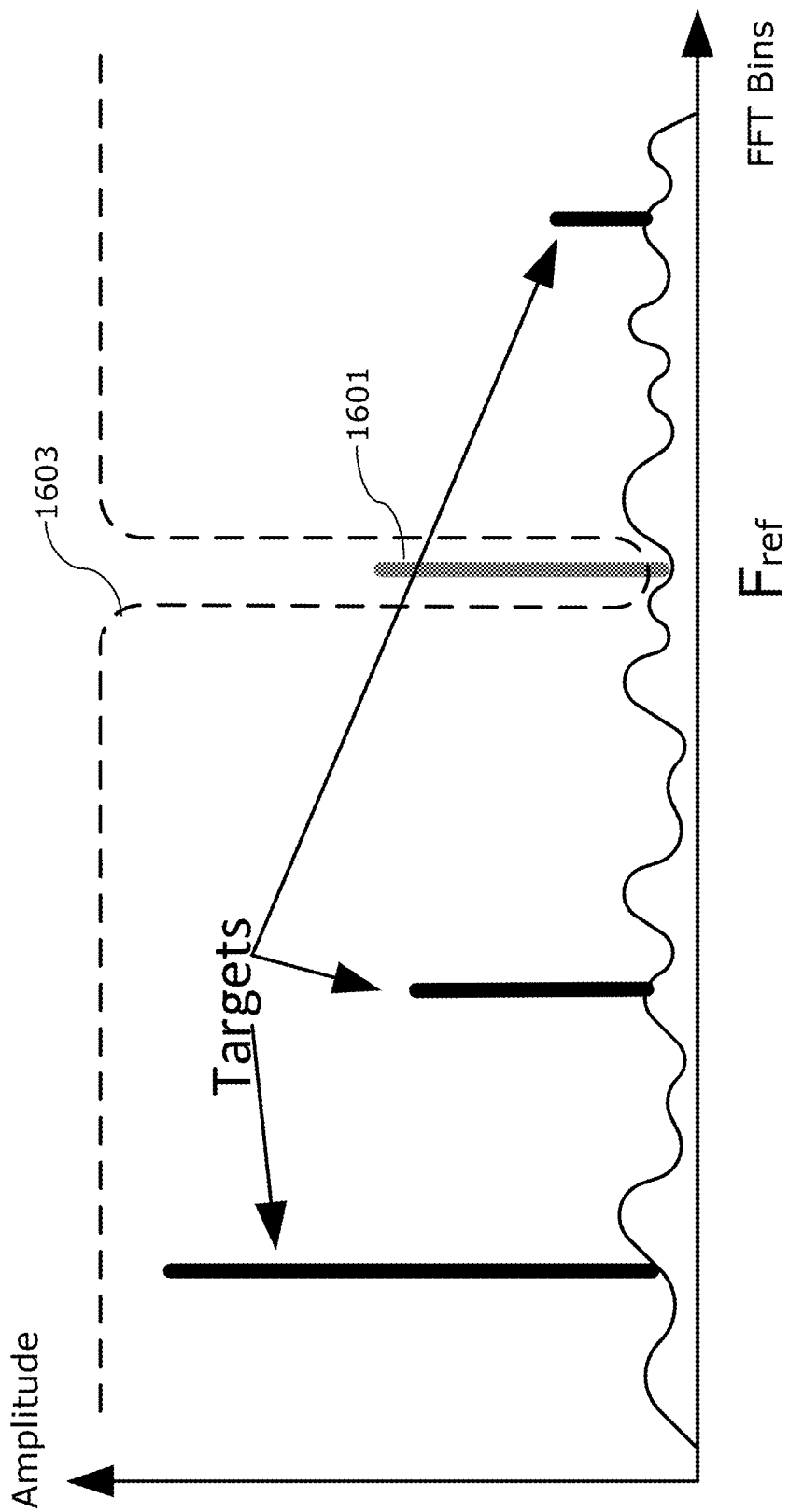
FIG. 16 illustrates the frequency response of a digital filter for spurious components reduction, in an example.

FIG. 16 illustrates the frequency response of a digital filter for spurious components reduction, in an example. The digital filter in FIG. 16 may be used as the spurious components reduction circuit 163 of FIG. 15. In FIG. 16, the dashed line 1603 shows the frequency response of the digital filter (e.g., a stop-band filter), which has a null at the frequency bin corresponding to the reference frequency $F_{ref}$. FIG. 16 further illustrates three frequency components corresponding to targets, which frequency components are in the pass-band of the digital filter. The example of FIG. 16 is merely a non-limiting example, the frequency response of the digital filter may include more than one nulls to reject more than one harmonic frequency components.

Figure 17:
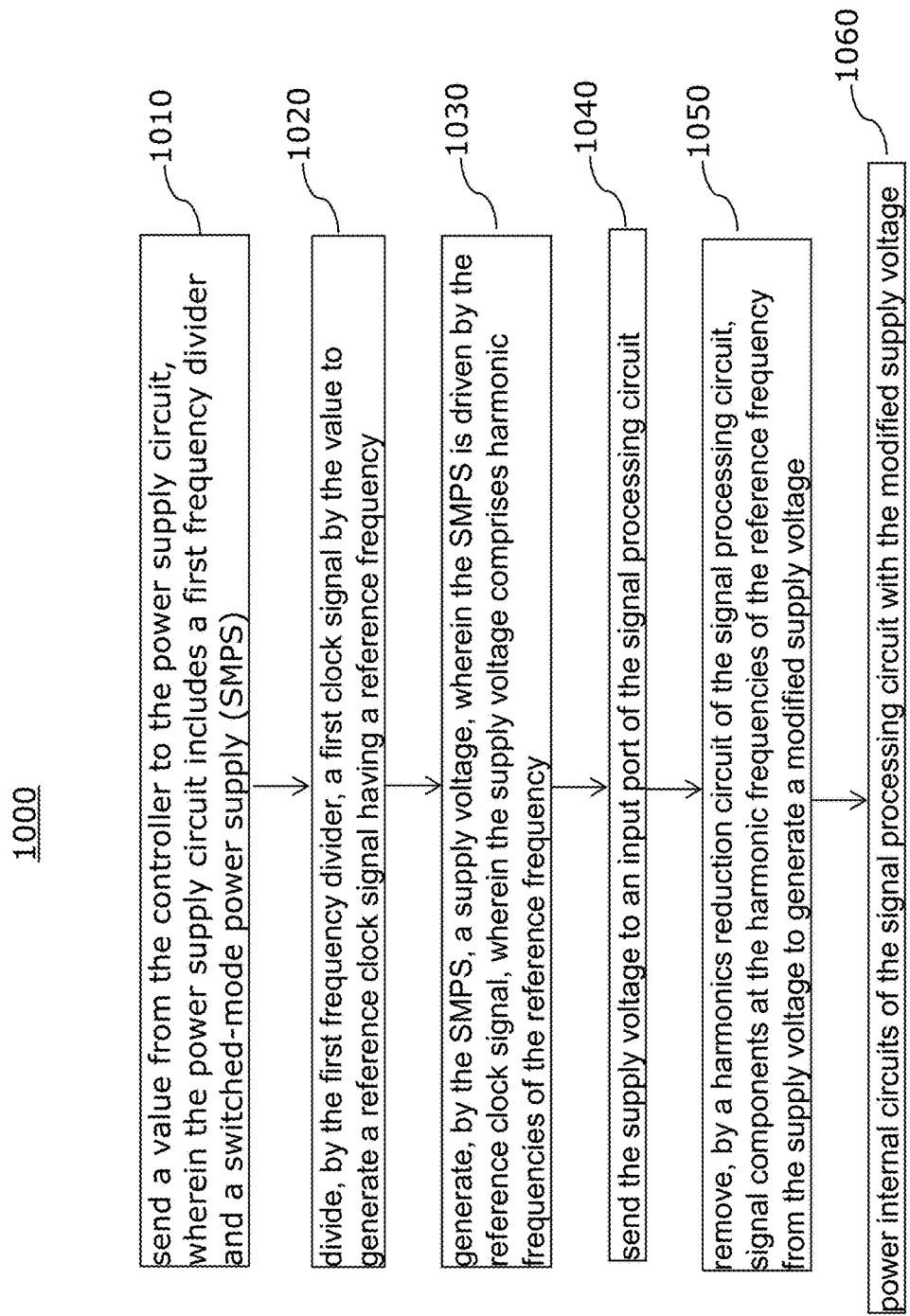
FIG. 17 illustrates a flow chart of a method of operating a system that includes a controller, a power supply circuit, and a signal processing circuit, in some examples.

FIG. 17 illustrates a flow chart of a method 1000 of operating a system that includes a controller, a power supply circuit, and a signal processing circuit, in some examples. It should be understood that the example method shown in FIG. 17 is merely an example of many possible example methods. One of ordinary skill in the art would recognize many variations, alternatives, and modifications. For example, various steps as illustrated in FIG. 17 may be added, removed, replaced, rearranged, or repeated.

Referring to FIG. 17, in block 1010, a value is sent from the controller to the power supply circuit, wherein the power supply circuit includes a first frequency divider and a switched-mode power supply (SMPS). In block 1020, the first frequency divider divides a first clock signal by the value to generate a reference clock signal having a reference frequency. In block 1030, a supply voltage is generated by the SMPS, wherein the SMPS is driven by the reference clock signal, wherein the supply voltage comprises harmonic frequencies of the reference frequency. In block 1040, the supply voltage is sent to an input port of the signal processing circuit. In block 1050, a harmonics reduction circuit of the signal processing circuit removes signal components at the harmonic frequencies of the reference frequency from the supply voltage to generate a modified supply voltage. In block 1060, internal circuits of the signal processing circuit are powered with the modified supply voltage.

Examples may achieve advantages. For example, the spurious components cancellation circuit 138 of FIG. 4A adaptively tracks and removes the harmonic frequency components of the reference frequency from the supply voltage, which generate a modified supply voltage that is cleaner (e.g., containing less harmonic frequency components). Since the cleaner modified supply voltage is used to power functional blocks of the signal processing circuit (e.g., RF circuit 121), the signals in the signal processing circuit is also cleaner, which results in better system performance. As another example, the spurious components reduction circuit 163 of FIG. 15A adaptively filters out one or more harmonic frequency components of the reference frequency, resulting in cleaner digital samples of the received RF signal. The cleaner digital sample allows for better target detection.

Examples of the present invention are summarized here. Other examples can also be understood from the entirety of the specification and the claims filed herein.

Example 1. In an example, an integrated circuit includes a first input port configured to receive a supply voltage from a switched-mode power supply (SMPS), where frequency components of the supply voltage include harmonics of a reference frequency, where the reference frequency is equal to a first frequency divided by a factor; and a spurious components cancellation circuit coupled to the first input port, where the spurious components cancellation circuit is configured to: generate a first clock signal having the reference frequency; adjust an amplitude and a phase of the first clock signal to form a compensation signal; and add the compensation signal to the supply voltage to produce a modified supply voltage with reduced frequency components at one or more harmonic frequencies of the reference frequency.

Example 2. The integrated circuit of Example 1, wherein the spurious components cancellation circuit comprises: a frequency divider, wherein the frequency divider is configured to divide a second clock signal having the first frequency by the factor to generate, at an output of the frequency divider, the first clock signal; an adjustment circuit coupled to the output of the frequency divider and configured to generate, at an output of the adjustment circuit, the compensation signal by adjusting the amplitude and the phase of the first clock signal; and a coupling circuit configured to add the output of the adjustment circuit to the supply voltage such that the modified supply voltage is generated at an output of the coupling circuit.

Example 3. The integrated circuit of Example 2, wherein the adjustment circuit comprises: an attenuator coupled to the frequency divider, wherein the attenuator is configured to adjust the amplitude of the first clock signal; and a phase shifter coupled to the attenuator, wherein the phase shifter is configured to adjust the phase of the first clock signal.

Example 4. The integrated circuit of Example 3, wherein the phase shifter comprises a digital counter, wherein the digital counter is configured to load an initial value and count down from the initial value to a terminal value, wherein the digital counter is configured to generate, at an output of the digital counter, a pulse when the digital counter counts down to the terminal value.

Example 5. The integrated circuit of Example 2, further comprising a digital interface, wherein the digital interface is configured to receive a signal indicating the factor.

Example 6. The integrated circuit of Example 2, wherein the spurious components cancellation circuit further comprises a control circuit coupled to an output of the coupling circuit and to the adjustment circuit, wherein the control circuit is configured to: measure the harmonics of the reference frequency in an output signal at the output of the coupling circuit; based on measurements of the harmonics of the reference frequency, determine an amplitude adjustment value and a phase adjustment value for the adjustment circuit; and send the amplitude adjustment value and the phase adjustment value to the adjustment circuit to adjust the amplitude and the phase of the first clock signal.

Example 7. The integrated circuit of Example 6, wherein the control circuit is configured to measure the harmonics of the reference frequency by: collecting samples of the output signal at the output of the coupling circuit; performing a frequency analysis of the collected samples; selecting frequency components of the collected samples corresponding to the harmonics of the reference frequency; and calculating a weighted sum of the selected frequency components.

Example 8. The integrated circuit of Example 7, wherein weight factors for calculating the weighted sum are programmable.

Example 9. The integrated circuit of Example 7, wherein the amplitude adjustment value and the phase adjustment value are determined by the control circuit to minimize the weighted sum of the selected frequency components.

Example 10. The integrated circuit of Example 1, further comprising: a second input port configured to receive a radio frequency (RF) signal; a mixer configured to mix the RF signal with an output of a local oscillator (LO); an analog front-end (AFE) circuit coupled to an output of the mixer; and an analog-to-digital converter (ADC) coupled to an output of the AFE circuit, wherein the modified supply voltage is used to power at least one of the mixer, the AFE circuit, and the ADC.

Example 11. In an example, a system includes a controller and a power management integrated circuit (PMIC) coupled to the controller, wherein the PMIC comprises: a first frequency divider, wherein the first frequency divider is configured to generate a reference clock signal by dividing a first clock signal by a programmable factor, wherein the programmable factor is sent from the controller, wherein the reference clock signal has a reference frequency; and a switched-mode power supply (SMPS) driven by the reference clock signal, wherein the SMPS is configured to generate, at an output of the SMPS, a supply voltage, wherein the supply voltage comprises a DC component and harmonic frequency components of the reference frequency. The system further includes an integrated circuit (IC) coupled to the PMIC and the controller, wherein the IC comprises: a first input port coupled to the output of the SMPS; and a harmonics reduction circuit coupled to the first input port, wherein the harmonics reduction circuit is configured to receive the programmable factor from the controller, and is configured to attenuate the harmonic frequency components of the reference frequency.

Example 12. The system of Example 11, wherein the IC further comprises: a second input port configured to receive a radio frequency (RF) signal; and a receiver circuit coupled to the second input port and an output of the harmonics reduction circuit, wherein the receiver circuit is configured to process the RF signal and to produce digital samples of the RF signal.

Example 13. The system of Example 11, wherein the controller is configured to send a first value for the programmable factor during a first time interval, and is configured to send a second value for the programmable factor during a second time interval.

Example 14. The system of Example 13, wherein the reference frequency during the first time interval is different from the reference frequency during the second time interval, wherein the harmonics reduction circuit is configured to adapt to different values for the programmable factor to reduce the harmonic frequency components of the reference frequency at an output of the harmonics reduction circuit.

Example 15. The system of Example 11, wherein the harmonics reduction circuit comprises a programmable digital filter.

Example 16. The system of Example 15, wherein the programmable digital filter is configured to reject at least one of the harmonic frequency components of the reference frequency.

Example 17. The system of Example 11, wherein the harmonics reduction circuit comprises: a second frequency divider configured to generate a second clock signal by dividing the first clock signal by the programmable factor; an adjustment circuit comprising an attenuator and a phase shifter, wherein the adjustment circuit is configured to generate a compensation signal by adjusting an amplitude of the second clock signal using the attenuator and by adjusting a phase of the second clock signal using the phase shifter; an coupling circuit configured to generate a modified supply voltage by adding the compensation signal to the supply voltage; and an adaptive control circuit coupled to an output of the coupling circuit and the adjustment circuit, wherein the adaptive control circuit is configured to adjust a gain of the attenuator and to adjust a phase value of the phase shifter.

Example 18. The system of Example 17, wherein the adaptive control circuit is configured to: perform a frequency analysis of an output signal of the harmonics reduction circuit; compute a weighted sum of the harmonic frequency components of the reference frequency in the output signal; and update the gain of the attenuator and the phase value of the phase shifter to reduce the weighted sum.

Example 19. In an example, a method of operating a system comprising a controller, a power supply circuit, and a signal processing circuit includes: sending a value from the controller to the power supply circuit, wherein the power supply circuit includes a first frequency divider and a switched-mode power supply (SMPS); dividing, by the first frequency divider, a first clock signal by the value to generate a reference clock signal having a reference frequency; generating, by the SMPS, a supply voltage, wherein the SMPS is driven by the reference clock signal, wherein the supply voltage comprises harmonic frequencies of the reference frequency; sending the supply voltage to an input port of the signal processing circuit; removing, by a harmonics reduction circuit of the signal processing circuit, signal components at the harmonic frequencies of the reference frequency from the supply voltage to generate a modified supply voltage; and powering internal circuits of the signal processing circuit with the modified supply voltage.

Example 20. The method of Example 19, wherein removing, by the harmonics reduction circuit of the signal processing circuit, the signal components at the harmonic frequencies of the reference frequency comprises: receiving, by the signal processing circuit, the value from the controller; dividing, by a second frequency divider, the first clock signal by the value to generate a second clock signal; adjusting an amplitude and a phase of the second clock signal using an attenuator and a phase shifter, respectively, to generate a compensation signal; and add the compensation signal to the supply voltage to generate the modified supply voltage.

Example 21. The method of Example 20, wherein adjusting the amplitude and the phase of the second clock signal comprises: performing a frequency analysis of the modified supply voltage; computing a weighted sum of frequency components of the modified supply voltage corresponding to the harmonic frequencies of the reference frequency; and updating a gain of the attenuator and a phase value of the phase shifter to reduce the weighted sum.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. An integrated circuit comprising:
a first input port configured to receive a supply voltage from a switched-mode power supply (SMPS), wherein frequency components of the supply voltage comprise harmonics of a reference frequency, wherein the reference frequency is equal to a first frequency divided by a factor; and
a spurious components cancellation circuit coupled to the first input port, wherein the spurious components cancellation circuit is configured to:
generate a first clock signal having the reference frequency;
adjust an amplitude and a phase of the first clock signal to form a compensation signal; and
add the compensation signal to the supply voltage to produce a modified supply voltage with reduced frequency components at one or more harmonic frequencies of the reference frequency.

2. The integrated circuit of claim 1, wherein the spurious components cancellation circuit comprises:
a frequency divider, wherein the frequency divider is configured to divide a second clock signal having the first frequency by the factor to generate, at an output of the frequency divider, the first clock signal;
an adjustment circuit coupled to the output of the frequency divider and configured to generate, at an output of the adjustment circuit, the compensation signal by adjusting the amplitude and the phase of the first clock signal; and
a coupling circuit configured to add the output of the adjustment circuit to the supply voltage such that the modified supply voltage is generated at an output of the coupling circuit.

3. The integrated circuit of claim 2, wherein the adjustment circuit comprises:
an attenuator coupled to the frequency divider, wherein the attenuator is configured to adjust the amplitude of the first clock signal; and
a phase shifter coupled to the attenuator, wherein the phase shifter is configured to adjust the phase of the first clock signal.

4. The integrated circuit of claim 3, wherein the phase shifter comprises a digital counter, wherein the digital counter is configured to load an initial value and count down from the initial value to a terminal value, wherein the digital counter is configured to generate, at an output of the digital counter, a pulse when the digital counter counts down to the terminal value.

5. The integrated circuit of claim 2, further comprising a digital interface, wherein the digital interface is configured to receive a signal indicating the factor.

6. The integrated circuit of claim 2, wherein the spurious components cancellation circuit further comprises a control circuit coupled to an output of the coupling circuit and to the adjustment circuit, wherein the control circuit is configured to:
measure the harmonics of the reference frequency in an output signal at the output of the coupling circuit;
based on measurements of the harmonics of the reference frequency, determine an amplitude adjustment value and a phase adjustment value for the adjustment circuit; and
send the amplitude adjustment value and the phase adjustment value to the adjustment circuit to adjust the amplitude and the phase of the first clock signal.

7. The integrated circuit of claim 6, wherein the control circuit is configured to measure the harmonics of the reference frequency by:
collecting samples of the output signal at the output of the coupling circuit;
performing a frequency analysis of the collected samples;
selecting frequency components of the collected samples corresponding to the harmonics of the reference frequency; and
calculating a weighted sum of the selected frequency components.

8. The integrated circuit of claim 7, wherein weight factors for calculating the weighted sum are programmable.

9. The integrated circuit of claim 7, wherein the amplitude adjustment value and the phase adjustment value are determined by the control circuit to minimize the weighted sum of the selected frequency components.

10. The integrated circuit of claim 1, further comprising:
a second input port configured to receive a radio frequency (RF) signal;
a mixer configured to mix the RF signal with an output of a local oscillator (LO);
an analog front-end (AFE) circuit coupled to an output of the mixer; and
an analog-to-digital converter (ADC) coupled to an output of the AFE circuit, wherein the modified supply voltage is used to power at least one of the mixer, the AFE circuit, and the ADC.

11. A system comprising:
a controller;
a power management integrated circuit (PMIC) coupled to the controller, wherein the PMIC comprises:
a first frequency divider, wherein the first frequency divider is configured to generate a reference clock signal by dividing a first clock signal by a programmable factor, wherein the programmable factor is sent from the controller, wherein the reference clock signal has a reference frequency; and
a switched-mode power supply (SMPS) driven by the reference clock signal, wherein the SMPS is configured to generate, at an output of the SMPS, a supply voltage, wherein the supply voltage comprises a DC component and harmonic frequency components of the reference frequency; and
an integrated circuit (IC) coupled to the PMIC and the controller, wherein the IC comprises:
a first input port coupled to the output of the SMPS; and
a harmonics reduction circuit coupled to the first input port, wherein the harmonics reduction circuit is configured to receive the programmable factor from the controller, and is configured to attenuate the harmonic frequency components of the reference frequency.

12. The system of claim 11, wherein the IC further comprises:
a second input port configured to receive a radio frequency (RF) signal; and
a receiver circuit coupled to the second input port and an output of the harmonics reduction circuit, wherein the receiver circuit is configured to process the RF signal and to produce digital samples of the RF signal.

13. The system of claim 11, wherein the controller is configured to send a first value for the programmable factor during a first time interval, and is configured to send a second value for the programmable factor during a second time interval.

14. The system of claim 13, wherein the reference frequency during the first time interval is different from the reference frequency during the second time interval, wherein the harmonics reduction circuit is configured to adapt to different values for the programmable factor to reduce the harmonic frequency components of the reference frequency at an output of the harmonics reduction circuit.

15. The system of claim 11, wherein the harmonics reduction circuit comprises a programmable digital filter.

16. The system of claim 15, wherein the programmable digital filter is configured to reject at least one of the harmonic frequency components of the reference frequency.

17. The system of claim 11, wherein the harmonics reduction circuit comprises:
   a second frequency divider configured to generate a second clock signal by dividing the first clock signal by the programmable factor;
   an adjustment circuit comprising an attenuator and a phase shifter, wherein the adjustment circuit is configured to generate a compensation signal by adjusting an amplitude of the second clock signal using the attenuator and by adjusting a phase of the second clock signal using the phase shifter;
   an coupling circuit configured to generate a modified supply voltage by adding the compensation signal to the supply voltage; and
   an adaptive control circuit coupled to an output of the coupling circuit and the adjustment circuit, wherein the adaptive control circuit is configured to adjust a gain of the attenuator and to adjust a phase value of the phase shifter.

18. The system of claim 17, wherein the adaptive control circuit is configured to:
   perform a frequency analysis of an output signal of the harmonics reduction circuit;
   compute a weighted sum of the harmonic frequency components of the reference frequency in the output signal; and
   update the gain of the attenuator and the phase value of the phase shifter to reduce the weighted sum.

19. A method of operating a system comprising a controller, a power supply circuit, and a signal processing circuit, the method comprising:
   sending a value from the controller to the power supply circuit, wherein the power supply circuit includes a first frequency divider and a switched-mode power supply (SMPS);
   dividing, by the first frequency divider, a first clock signal by the value to generate a reference clock signal having a reference frequency;
   generating, by the SMPS, a supply voltage, wherein the SMPS is driven by the reference clock signal, wherein the supply voltage comprises harmonic frequencies of the reference frequency;
   sending the supply voltage to an input port of the signal processing circuit;
   removing, by a harmonics reduction circuit of the signal processing circuit, signal components at the harmonic frequencies of the reference frequency from the supply voltage to generate a modified supply voltage; and
   powering internal circuits of the signal processing circuit with the modified supply voltage.

20. The method of claim 19, wherein removing, by the harmonics reduction circuit of the signal processing circuit, the signal components at the harmonic frequencies of the reference frequency comprises:
   receiving, by the signal processing circuit, the value from the controller;
   dividing, by a second frequency divider, the first clock signal by the value to generate a second clock signal;
   adjusting an amplitude and a phase of the second clock signal using an attenuator and a phase shifter, respectively, to generate a compensation signal; and
   add the compensation signal to the supply voltage to generate the modified supply voltage.

21. The method of claim 20, wherein adjusting the amplitude and the phase of the second clock signal comprises:
   performing a frequency analysis of the modified supply voltage;
   computing a weighted sum of frequency components of the modified supply voltage corresponding to the harmonic frequencies of the reference frequency; and
   updating a gain of the attenuator and a phase value of the phase shifter to reduce the weighted sum.

* * * * *